(12) United States Patent
Yasuda et al.

(10) Patent No.: US 6,831,765 B2
(45) Date of Patent: Dec. 14, 2004

(54) TILTABLE-BODY APPARATUS, AND METHOD OF FABRICATING THE SAME

(75) Inventors: Susumu Yasuda, Tokyo (JP);
Hidemasa Mizutani, Kanagawa (JP);
Takayuki Yagi, Kanagawa (JP);
Yasuhiro Shimada, Kanagawa (JP);
Futoshi Hirose, Kanagawa (JP);
Takahisa Kato, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 52 days.

(21) Appl. No.: 10/073,304

(22) Filed: Feb. 13, 2002

(65) Prior Publication Data

US 2002/0114053 A1 Aug. 22, 2002

(30) Foreign Application Priority Data

| Feb. 22, 2001 | (JP) | 2001-047295 |
| Feb. 22, 2001 | (JP) | 2001-047296 |
| Feb. 22, 2001 | (JP) | 2001-047297 |
| Sep. 14, 2001 | (JP) | 2001-278956 |
| Sep. 14, 2001 | (JP) | 2001-279383 |
| Sep. 28, 2001 | (JP) | 2001-301663 |

(51) Int. Cl.$^7$ .................. G02B 26/08; A47B 97/04
(52) U.S. Cl. .................. 359/224; 359/198; 359/199; 248/560; 310/66
(58) Field of Search .................. 359/198–199, 359/221, 223–224, 17, 566; 248/466, 468, 560; 73/65.08, 650, 514.24; 310/36, 40 R, 66, 75 A, 40 MM

(56) References Cited

U.S. PATENT DOCUMENTS

| 4,317,611 A | 3/1982 | Petersen |
| 5,317,152 A | 5/1994 | Takamatsu et al. ......... 250/306 |
| 5,357,108 A | 10/1994 | Suzuki et al. ............... 250/306 |
| 5,554,851 A | 9/1996 | Hirai et al. ............. 250/442.11 |
| 5,574,279 A | 11/1996 | Ikeda et al. ................. 250/306 |
| 5,739,941 A * | 4/1998 | Knipe et al. ................ 359/224 |
| 5,751,684 A | 5/1998 | Takeda et al. .............. 369/126 |
| 5,923,637 A | 7/1999 | Shimada et al. ............ 369/126 |
| 6,046,972 A | 4/2000 | Kuroda et al. ............. 369/126 |
| 6,163,519 A | 12/2000 | Kuroda et al. ............. 369/126 |
| 6,198,565 B1 | 3/2001 | Iseki et al. .................. 359/224 |
| 6,337,477 B1 | 1/2002 | Shimada et al. ............ 250/216 |
| 6,445,484 B1 * | 9/2002 | Miyajima et al. .......... 359/224 |
| 6,556,333 B2 * | 4/2003 | Tokuda et al. .............. 359/224 |

FOREIGN PATENT DOCUMENTS

| EP | 0 692 729 A1 | 1/1996 |
| JP | 2000-214407 | 8/2000 |
| WO | WO 01/04638 A1 | 1/2001 |

OTHER PUBLICATIONS

Muller, L., et al., "Mechanical Performance Of An Integrated Microgimbal/Microactuator For Disk Drives," 10$^{th}$ International Conference on Solid–State Sensors and Actuators, Tranducers '99, pp. 1002–1005, Jun. 7–10, 1999, Sendai, Japan.

* cited by examiner

Primary Examiner—James Phan
(74) Attorney, Agent, or Firm—Fitzpatrick, Cella, Harper & Scinto

(57) ABSTRACT

The tiltable-body apparatus including a frame member, a tiltable body, and a pair of torsion springs having a twisting longitudinal axis. The torsion springs are disposed along the twisting longitudinal axis opposingly with the tiltable body being interposed, support the tiltable body flexibly and rotatably about the twisting longitudinal axis relative to the frame member, and include a plurality of planar portions, compliant directions of which intersect each other when viewed along a direction of the twisting longitudinal axis. A center of gravity of the tiltable body is positioned on the twisting longitudinal axis of the torsion springs.

58 Claims, 37 Drawing Sheets

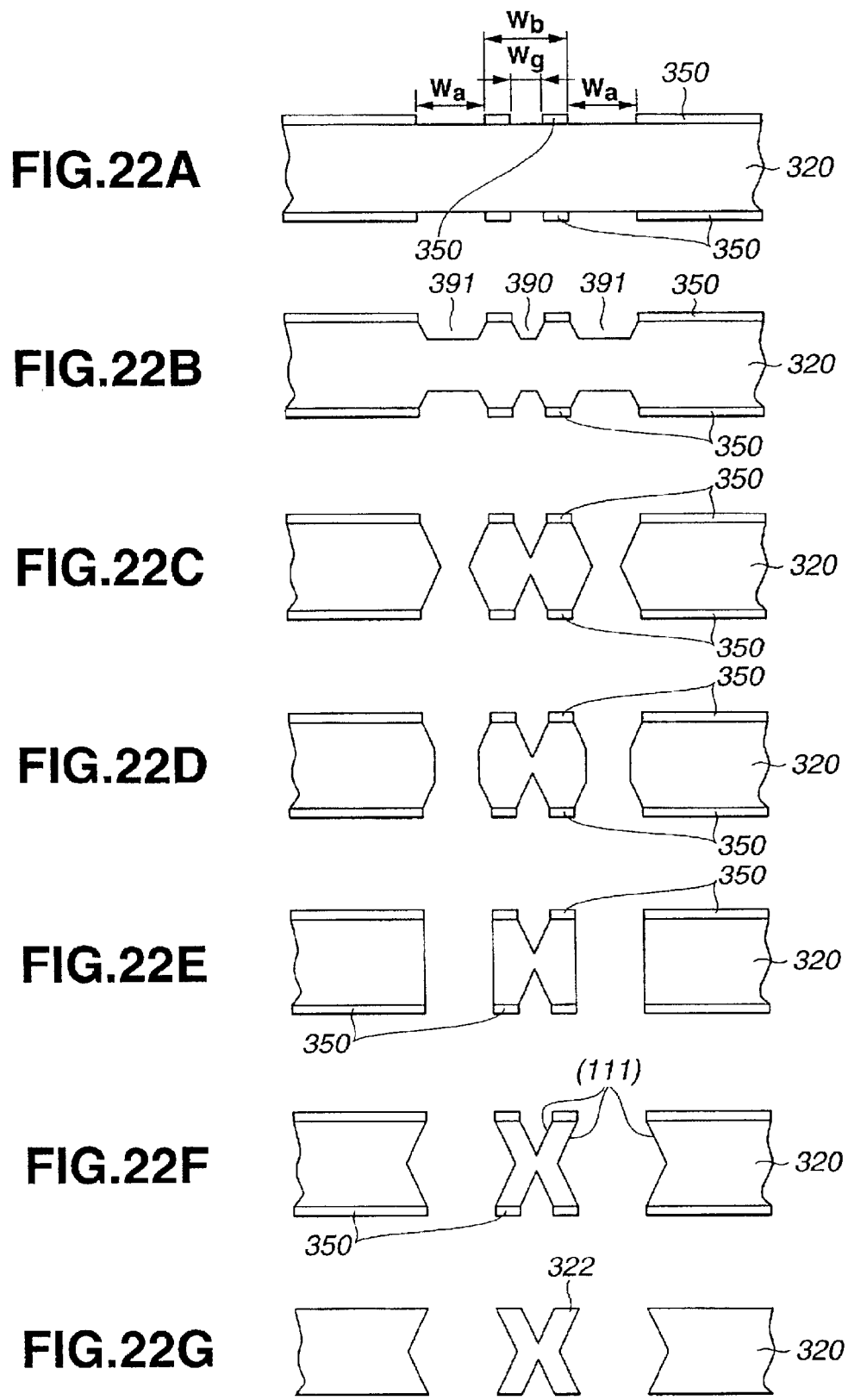

TWISTING CENTER OF TORSION SPRING 629a, (111) face

FIG.35
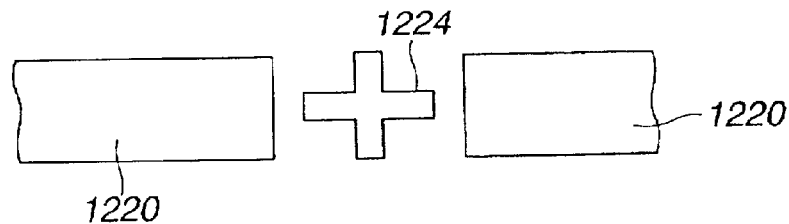
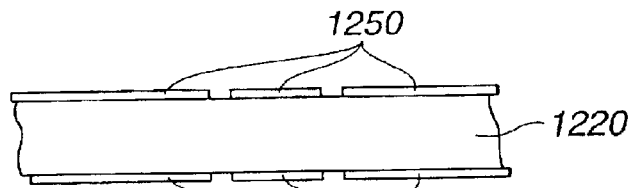
FIG.36A
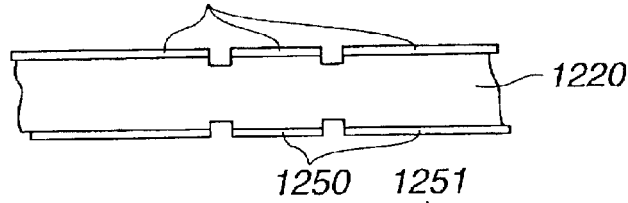
FIG.36B
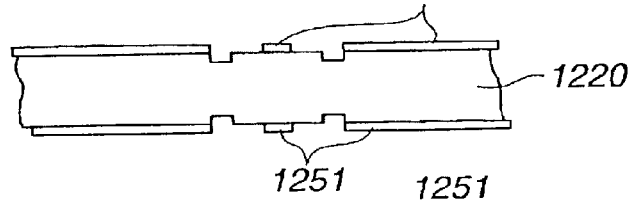
FIG.36C
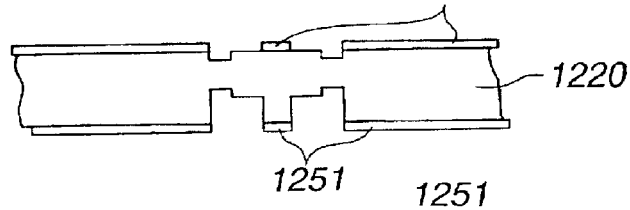
FIG.36D
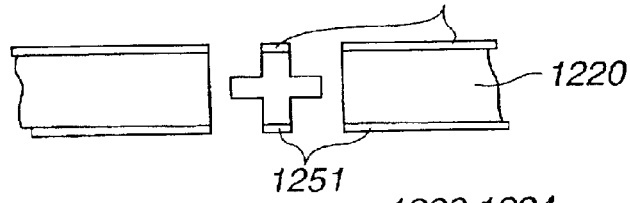
FIG.36E
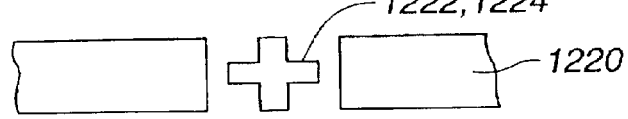
FIG.36F

| | CROSS SECTION ALONG LINE 1306 | CROSS SECTION ALONG LINE 1309 |
|---|---|---|
| FIG.42A | 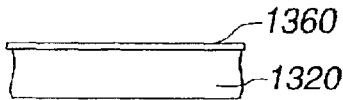 | 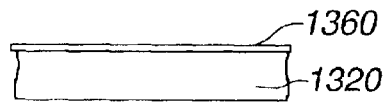 |
| FIG.42B | 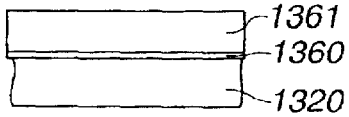 | |
| FIG.42C | 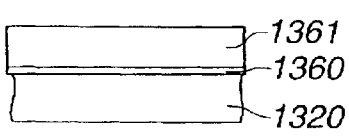 | 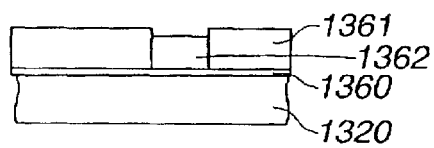 |
| FIG.42D | 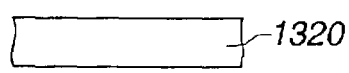 | 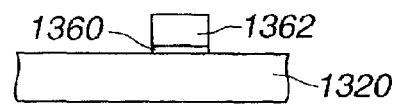 |
| FIG.42E | 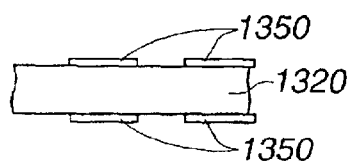 | 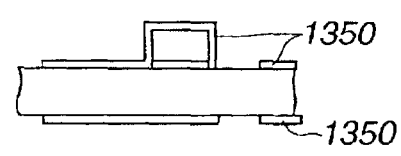 |
| FIG.42F | 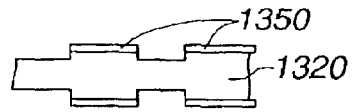 |  |
| FIG.42G | 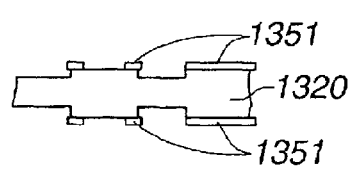 | 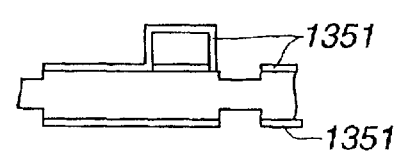 |
| FIG.42H | 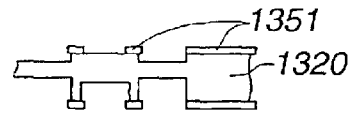 | 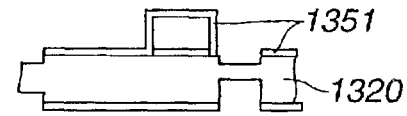 |
| FIG.42I | 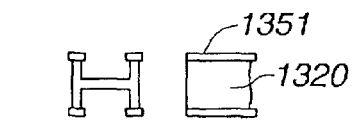 | 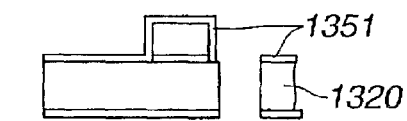 |
| FIG.42J | 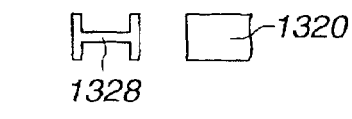 | 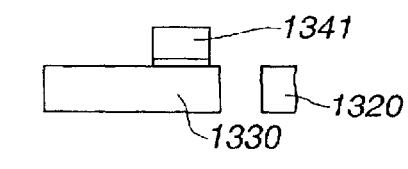 |

| | CROSS SECTION ALONG LINE 1506 | CROSS SECTION ALONG LINE 1509 |
|---|---|---|
| FIG.53A | 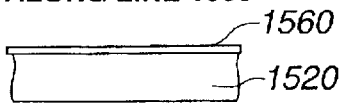 |  |
| FIG.53B | 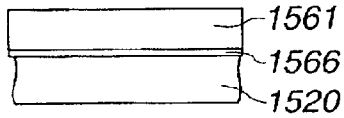 | 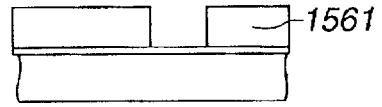 |
| FIG.53C | 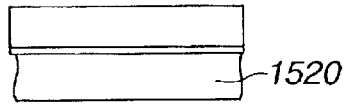 | 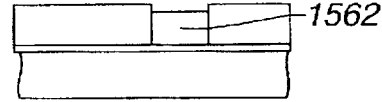 |
| FIG.53D | 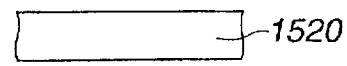 | 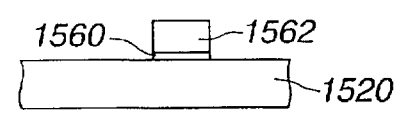 |
| FIG.53E |  | 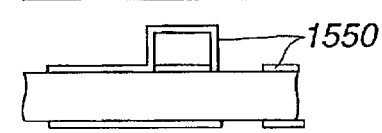 |
| FIG.53F | 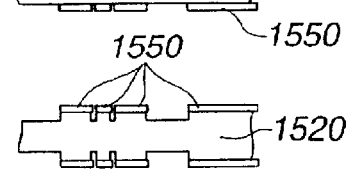 | 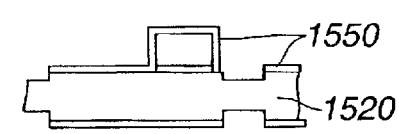 |
| FIG.53G | 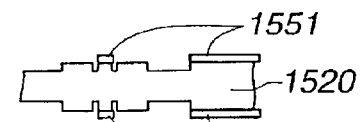 | 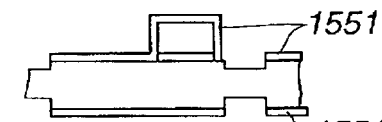 |
| FIG.53H | 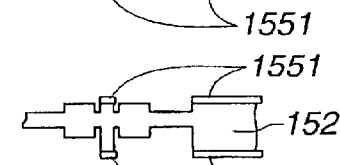 | 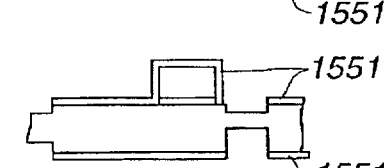 |
| FIG.53I | 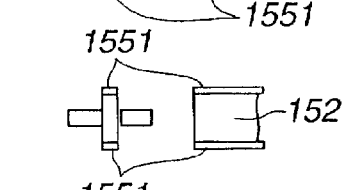 | 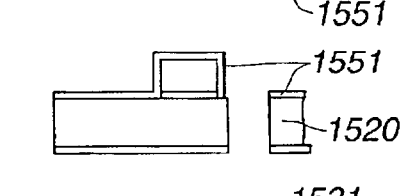 |
| FIG.53J | 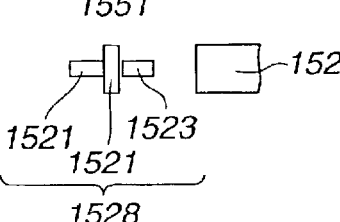 | 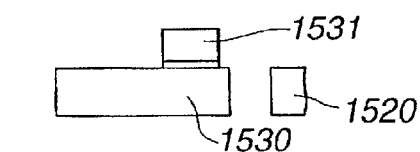 |

TILTABLE-BODY APPARATUS, AND METHOD OF FABRICATING THE SAME

BACKGROUND OF THE INVENTION

1. Field of the Invention

The present invention relates to a tiltable-body apparatus with a tiltable body which can be reciprocally tilted about a twisting longitudinal axis, such as micro-sensors for sensing mechanical amounts, micro-actuators, and optical micro-scanners, and a method of fabricating the tiltable-body apparatus.

2. Description of the Related Background Art

It is well known that surface forces become more dominant than volume forces as the size of mechanical elements decreases and the influence of friction thus increases in such machines more than in normally-sized machines. Accordingly, in designing micro-machines, it is generally necessary to consider the reduction of the number of sliding portions and rotating portions as much as possible.

A conventional optical scanner with a tiltable body oscillating about a twisting longitudinal axis will be described. FIG. 1 illustrates the optical scanner disclosed in U.S. Pat. No. 4,317,611. FIG. 2 illustrates a disassembled view of this optical scanner to clearly show its internal structure. FIGS. 3 and 4 illustrate cross sections of a silicon thin plate 2020 taken along lines 2003 and 2006 in FIG. 1, respectively.

In the above optical scanner, a recess 2012 is formed in a substrate 2010 of an insulating material. A pair of driver electrodes 2014 and 2016 and a mirror support portion 2032 are provided on the bottom of the recess 2012. A pair of torsion bars 2022 and 2024 and a mirror 2030 are integrally formed in the silicon plate 2020. An upper surface of the mirror 2030 is coated with a highly-reflective material, and the mirror 2030 is rotatably supported by the torsion bars 2022 and 2024. The silicon plate 2020 is disposed above the substrate 2010 with a predetermined distance between the silicon plate 2020 and the driver electrodes 2014 and 2016 being set as illustrated in FIG. 3.

The silicon plate 2020 is electrically grounded. A voltage is alternately applied to each of the driver electrodes 2014 and 2016 to attract the mirror 2030 by an electrostatic force. The mirror 2030 is thus tilted about the longitudinal axis of the torsion bars 2022 and 2024.

The cross section of the torsion bars 2022 and 2024 has a shape of trapezoid as illustrated in FIG. 4. In a microstructure with such torsion bars, however, since the torsion bar is likely to bend in a direction perpendicular to its longitudinal axis, the microstructure can be easily affected by external vibrations and the longitudinal axis of the torsion bar can be easily shifted. Accordingly, it is difficult to attain an accurate driving in such a microstructure.

Therefore, when the above optical scanner is used in an optical scanning type display, its image and spot profile are likely to shift and vary due to the external vibrations. This disadvantage increases when the scanning type display is constructed in a small portable form.

The following structure has been proposed to solve the above-discussed disadvantage of the torsion bar. FIG. 5 illustrates a gimbal plate 2120 for a hard disc head disclosed in "10th International Conference on Solid-State Sensors and Actuators (Transducers '99) pp. 1002–1005". This gimbal plate 2120 is mounted on a tip portion of a suspension for the hard disc head so that rolling and pitching motions of a magnetic head are flexibly allowed. The gimbal plate includes a support frame 2131 which is rotatably supported by rolling torsion bars 2122 and 2124. There is also arranged inside the support frame 2131 a head support 2130 rotatably supported by pitching torsion bars 2126 and 2128. Twisting axes (indicated by dot-and-dash lines in FIG. 5) of rolling torsion bars 2122 and 2124 and pitching torsion bars 2126 and 2128 are orthogonal to each other, and hence, those torsion bars can achieve rolling and pitching motions of the head support 2130.

FIG. 6 is a cross-sectional view taken along a line 2106 of FIG. 5. As illustrated in FIG. 6, the cross section of each of the torsion bars 2122 and 2124 is T-shaped, and the gimbal plate 2120 has a structure with ribs.

A fabrication method of the above gimbal plate 2120 will be described with reference to FIGS. 7A to 7E. As illustrated in FIG. 7A, initially, a silicon wafer 2191 for molding is perpendicularly etched using an etching method such as ICP-RIE (Inductively Coupled Plasma-Reactive Ion Etching). The silicon wafer 2191 for molding can be re-used. A sacrificial layer 2192 of silicon oxide and phosphosilicate glass is then deposited on the silicon wafer 2191, as illustrated in FIG. 7B. After that, a poly-silicon layer 2193, which is to be the structure of the gimbal plate 2120, is formed as illustrated in FIG. 7C. The poly-silicon 2193 is then patterned as illustrated in FIG. 7D. Finally, the sacrificial layer 2192 is removed, and the poly-silicon layer 2193 is bonded to a patterned pad 2195 with an epoxy resin 2094, as illustrated in FIG. 7E.

The thus-fabricated torsion bar with the T-shaped cross section has the feature that its geometrical moment of inertia I is large while its polar moment of inertia J is relatively small, in contrast to a torsion bar having a circular or rectangular cross section. Therefore, the above torsion bar is relatively easy to twist while hard to bend. That is, this torsion bar has a sufficient compliance in a twisting direction and a high rigidity in a direction perpendicular to the twisting axis.

Further, in the above T-shaped torsion bar, the length for obtaining necessary compliance and permissible twisting angle is small, and hence, the torsion bar can be made compact in size.

Thus, a compact micro-gimbal plate with sufficient compliance in rolling and pitching directions and sufficient rigidity in other directions can be obtained.

However, the above-discussed microstructure has the following disadvantages.

1. In the torsion bar with the T-shaped cross section, a stress concentration is likely to occur at a portion 2150 of FIG. 6 when the torsion bar is twisted. Accordingly, the torsion bar is easy to break.

2. When the torsion bar with the T-shaped cross section is used, a twisting center of the torsion bar deviates from a center of gravity of the tiltable body. This phenomenon will be described with reference to FIGS. 8 and 9. FIG. 8 illustrates a T-shaped torsion bar 2922 one end of which is fixed and the other end of which supports a tiltable body 2930. FIG. 9 illustrates a side of the torsion bar 2922 viewed from a direction of view indicated by an arrow in FIG. 8. As illustrated by arrows in FIG. 9, since the twisting center of the T-shaped torsion bar 2922 deviates from the center of gravity of the tiltable body 2930, a vibratory force occurs in a direction perpendicular to the twisting longitudinal axis when the tiltable body 2930 is tilted. This causes unwanted noises in micro-sensors for mechanical amounts, unnecessary actions in micro-actuators, and deflection shifts of light in micro-optical scanners.

3. Internal loss of poly-silicon is larger than that of single crystal silicon. Accordingly, a mechanical Q-value of the poly-silicon is relatively small. The vibration amplitude cannot hence be increased when the tiltable body is driven by employing its mechanical resonance. Further, its energy efficiency is small since the driving loss is large.

SUMMARY OF THE INVENTION

It is an object of the present invention to provide a tiltable-body apparatus with good strength and performance including a tiltable body which can be reciprocally tilted about a twisting longitudinal axis, such as micro-sensors for sensing mechanical amounts, micro-actuators, and optical micro-scanners, and a method of fabricating the tiltable-body apparatus.

The present invention is generally directed to a tiltable-body apparatus including a frame member, a tiltable body, and a pair of torsion springs having a twisting longitudinal axis. The torsion springs are disposed along the twisting longitudinal axis opposingly with the tiltable body being interposed, support the tiltable body flexibly and rotatably about the twisting longitudinal axis relative to the frame member, and include a plurality of planar portions, compliant directions of which intersect each other when viewed along a direction of the twisting longitudinal axis. A center of gravity of the tiltable body is positioned on the twisting longitudinal axis of the torsion springs. This structure can provide a spring structure which can be readily twisted, but is hard to bend. Further, no unwanted vibratory force occurs in a direction perpendicular to the twisting longitudinal axis when the tiltable body is tilted.

More specifically, the following constructions can be preferably adopted based on the above fundamental construction.

The tiltable body can be a planar tiltable body, and at least one of the planar portions of the torsion springs extends slant to the planar tiltable body. Due to this structure, the torsion spring can be easily made difficult to bend in directions perpendicular to and parallel to the planar tiltable body.

The cross-sectional shape of each torsion spring perpendicular to the twisting longitudinal axis can be made 90-degree or 180-degree rotationally symmetric, and each torsion spring can be composed of a plurality of planar portions. This structure can provide a spring structure which can be further readily twisted, but is harder to bend.

Each torsion spring can be composed of a plurality of separate planar portions, longitudinal axes of which are set parallel to each other, and compliant directions of which intersect each other when viewed along the direction of the twisting longitudinal axis. Due to this structure, the separate planar portions reinforce each other such that the entire structure can have a high flexural rigidity and no vibratory forces perpendicular to the twisting longitudinal axis occurs at the tilting time. Further, since each planar portion has a simple cross section and separate, no great stress concentration occurs and the structure is drastically hard to break.

The cross-sectional shape of each torsion spring perpendicular to the twisting longitudinal axis can be made symmetric with respect to a plane including the twisting longitudinal axis. This structure also can provide a spring structure which can be further readily twisted, but is harder to bend.

The torsion springs can be formed of a single crystal material, such as single crystal silicon and quartz. In such a structure, its internal loss can be reduced, and a high energy efficiency can be attained. Further, a structure with a large mechanical Q-value can be achieved. The single crystal silicon is readily available, and excellent in mechanical characteristics (i.e., physical strength and durability are great, life is long, and specific gravity is small). When a (100) single crystal silicon is used, slant surfaces of the torsion springs can be readily achieved by (111) faces thereof.

Typically, the frame member, the tiltable body, and the torsion springs are integrally formed from a substrate of a single crystal material, such as single crystal silicon and quartz, by etching or the like.

The torsion springs can be formed by anisotropically etching the (100) single crystal silicon substrate, and slant surfaces of the torsion springs can be achieved by (111) faces of the single crystal silicon substrate. In this case, faces, relative to the (100) substrate face, of a root portion of each torsion spring, which connect to the silicon substrate, can be (111) faces of the single crystal silicon substrate. These torsion springs are hard to break since the (111) face is smoothly formed with high precision. Further, stress concentration to the root portion can be reduced, leading to an increase in reliability of the torsion springs.

The torsion springs can be formed by using a planar substrate, such as a silicon substrate, and performing a deep etching such as ICP-RIE. In this case, each torsion spring can be defined by faces perpendicular to the planar frame member and faces parallel to the planar frame member.

The cross section of each torsion spring perpendicular to the twisting longitudinal axis can have a shape of one of V, reversed-V, X, slash, broken-V, broken-reversed-V, crisscross, broken-crisscross, H, broken-H, N, and angular S.

Cross sections of the two torsion springs, which are opposingly arranged with the tiltable body being interposed, may be either the same, or different (see FIGS. 17A and 17B, for example).

Cross sections of the torsion springs perpendicular to the twisting longitudinal axis can be different and symmetric with each other with respect to a plane including the twisting longitudinal axis, or with respect to a plane including the twisting longitudinal axis and parallel to the planar tiltable body. In this structure, compliant directions of the torsion springs opposingly arranged with the tiltable body being interposed differ from each other, so that the spring structure can be readily twisted, but is hard to bend. Further, unnecessary modes of motion, and adverse influences of external disturbances due to the structure of one of the torsion springs can be offset by the structure of the other torsion spring.

Where each torsion spring includes a plurality of separate planar torsion bars, a cross section of each torsion spring may be symmetric with respect to a vertical line, or with respect to a horizontal line and a vertical line.

Angles of the torsion springs can be rounded by isotropic etching such that stress concentration on the angles of the torsion springs can be reduced.

The frame member can include an inner frame member and an outer frame member, and the tiltable body can include an inner tiltable body and an outer tiltable body which is the inner frame member for supporting the inner tiltable body through a pair of first torsion springs and is supported by the outer frame member through a pair of second torsion springs. In this structure, the inner tiltable body is supported flexibly and rotatably about a first twisting longitudinal axis of a pair of the first torsion springs, the outer tiltable body is supported flexibly and rotatably about a second twisting longitudinal axis of a pair of the second torsion springs, and pairs of the first and second torsion springs are disposed along the first and second twisting longitudinal axes opposingly with the inner and outer tiltable body being interposed, respectively. If necessary, more than two tiltable bodies can be flexibly and rotatably supported in such a manner (i.e., in a so-called gimbals fashion). Typically, the twisting longitudinal axes extend forming an angle of 90 degrees.

The tiltable-body apparatus can further include a detecting unit for detecting a relative displacement between the frame member and the tiltable body, and the apparatus can be constructed as a mechanical-amount sensor. The detecting unit detects a change in an electrostatic capacity between the frame member and the tiltable body through a change in a voltage therebetween, for example.

The tiltable-body apparatus can further include a driving unit for driving the tiltable body relative to the frame member, and the apparatus can be constructed as an actuator. The driving unit is typically composed of a stationary core formed of soft magnetic material, a coil wound on the stationary core, and a moving core bonded to the tiltable body. The moving core can be formed of either a soft magnetic material or a permanent magnet of hard magnetic material. When the moving core is formed of soft magnetic material, the driving principle is as follows. Magnetic poles of the soft magnetic material are not determined, and the soft magnetic material is attracted into a magnetic flux generated by the stationary core, such that a cross-sectional area where the soft magnetic material crosses the magnetic flux increases. The tiltable body is thus driven. Upon cease of the magnetic flux, the soft magnetic material is released from the magnetic flux.

When the moving core is formed of hard magnetic material, the driving principle is as follows. Magnetic poles of the hard magnetic material are determined, and the soft magnetic material is driven by an attractive force between different magnetic poles or a repulsive force between common magnetic poles. These two are electromagnetic actuators. Electrostatic forces can also be employed in an electrostatic actuator.

The tiltable-body apparatus can further include a driving unit for driving the tiltable body relative to the frame member, and a light deflecting unit for deflecting a beam of light impinging on the tiltable body, which is provided on the tiltable body, and the apparatus is constructed as an optical deflector. The driving unit can be constructed as described above. The light deflecting unit can be a light reflective mirror, or a diffraction grating. When the diffraction grating is used, a single beam can be deflected as a plurality of light beams (diffracted light).

The present invention is also directed to a scanning type display which includes the above-discussed optical deflector, a modulatable light source, and a control unit for controlling modulation of the modulatable light source and operation of the tiltable body of the optical deflector in an interlocking manner.

The present invention is further directed to a method of fabricating the above-discussed tiltable-body apparatus which includes the frame member formed of a (100) single crystal silicon substrate, the tiltable body formed of the (100) single crystal silicon substrate, and a pair of torsion springs having a twisting longitudinal axis, formed of the (100) single crystal silicon substrate, and including a plurality of planar portions defined by (100) and (111) faces of the single crystal silicon substrate. The method includes a step of depositing mask layers on both upper and lower surfaces of the (100) single crystal silicon substrate, respectively, a step of patterning the mask layers in accordance with configurations of the tiltable body and the torsion springs, and a step of anisotropically etching the (100) single crystal silicon substrate using the patterned mask layers. The anisotropic etching can be performed using an alkaline solution. The method may further include a step of rounding angles of the torsion springs by isotropic etching such that stress concentration on the angles of the torsion springs is reduced.

The present invention is further directed to a method of fabricating the above-discussed tiltable-body apparatus which includes a frame member formed of a planar substrate, a tiltable body formed of the planar substrate, and a pair of torsion springs having a twisting longitudinal axis, formed of the planar substrate, and including a plurality of planar portions defined by faces perpendicular to the planar substrate and faces parallel to the planar substrate. The method includes a step of depositing mask layers on both upper and lower surfaces of the planar substrate, respectively, a step of patterning the mask layers in accordance with configurations of the tiltable body and the torsion springs, a step of performing a deep etching of the planar substrate from one surface of the planar substrate, and a step of performing a deep etching of the planar substrate from the other surface of the planar substrate. The planar substrate can be a silicon substrate.

These advantages, as well as others will be more readily understood in connection with the following detailed description of the preferred embodiments of the invention in connection with the drawings.

BRIEF DESCRIPTION OF THE DRAWINGS

FIGS. 22A to 22G are cross-sectional views illustrating a method of processing a single crystal silicon thin plate of the second embodiment.

FIG. 35 is a cross-sectional view illustrating a torsion spring of the sixth embodiment taken along the line 1206 of FIG. 33.

FIGS. 36A to 36F are cross-sectional views illustrating a method of processing a single crystal silicon thin plate of the sixth embodiment.

FIGS. 42A to 42J are cross-sectional views illustrating a method of processing a single crystal silicon thin plate of the seventh embodiment taken along the lines 1306 and 1309 of FIG. 38.

FIGS. 53A to 53J are cross-sectional views illustrating a method of processing a single crystal silicon thin plate of the ninth embodiment taken along the lines 1506 and 1509 of FIG. 49.

DESCRIPTION OF THE PREFERRED EMBODIMENTS

A micro-optical scanner of a first embodiment according to the present invention will be described with reference to FIG. 10, FIG. 11A, FIG. 11B, FIG. 12 and FIG. 13.

Figure 13:
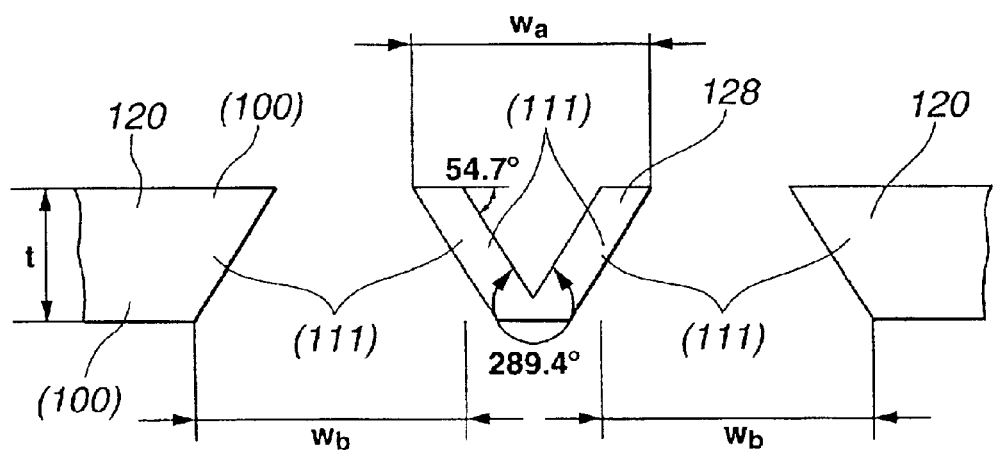
FIG. 13 is across-sectional view illustrating the torsion spring of the first embodiment taken along the line 106 of FIG. 10.

In the micro-optical scanner of the first embodiment, a recess 112 is formed on a glass substrate 110. A pair of driver electrodes 114 and 116 and a mirror support 132 of a triangular prism are arranged on the bottom of the recess 112. The mirror support 132 can be omitted. In a single crystal silicon thin plate 120, two sets of torsion springs 128 and 129 and a planar mirror 130 are integrally formed by bulk micromachining techniques. Each of the torsion springs 128 and 129 has a cross section of symmetrical V-shape, as illustrated in FIG. 13. This shape is a heptagonal shape with an internal angle of 289.4 degrees, and has two portions slant to a plane of the mirror 130.

Figure 12:
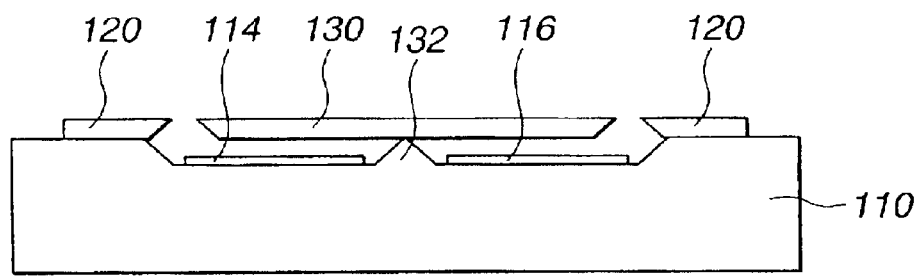
FIG. 12 is a cross-sectional view illustrating the first embodiment and other embodiments taken along the line 109 of FIG. 11A.

The mirror 130 has a flat surface coated with a highly-reflective material, and is supported by the V-shaped torsion springs 128 and 129 such that the mirror 130 can be freely tilted about the twisting longitudinal axis of these springs 128 and 129. The silicon plate 120 is disposed oppositely to the glass substrate 110 such that a predetermined distance can be set between the mirror 130 and the driver electrodes 114 and 116, as illustrated in FIG. 12. A bottom potion of the mirror 130 along the longitudinal axis of the torsion springs 128 and 129 is in contact with an apex portion of the mirror support 132, as illustrated in FIG. 12. The mirror 130 can hence be tilted about the longitudinal axis along that apex portion.

The single crystal silicon thin plate 120 is electrically grounded. Accordingly, the mirror 130 can be tilted about the twisting longitudinal axis when an electrostatic force is applied to the mirror 130 by alternately applying voltages to the driver electrodes 114 and 116. A magnetic force and the like can also be employed as the driving force. In such a case, the driver electrode is replaced by an electromagnet, and a magnet of hard magnetic material is fixed to the bottom of the mirror 130, for example.

A fabrication method of the optical scanner will be described with reference to FIGS. 15A to 15E and FIGS. 16A to 16E. FIGS. 15A to 15E are cross-sectional views taken along the line 106 of FIG. 10, and FIGS. 16A to 16E are cross-sectional views taken along the line 109 of FIG. 11A.

The silicon plate 120 is processed in the following manner, as illustrated in FIGS. 15A to 15E.

Figure 15A:
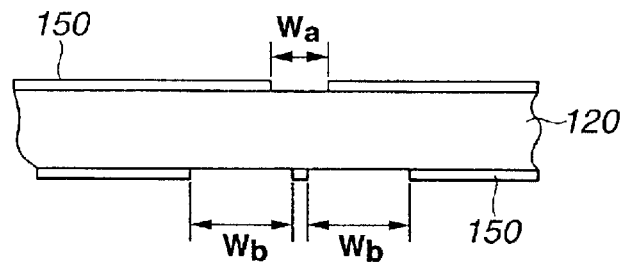
FIGS. 15A to 15E are cross-sectional views illustrating a method of processing a single crystal silicon thin plate of the first embodiment.

Mask layers 150 are formed on both surfaces of the silicon plate 120, respectively. The mask layer 150 is formed of $SiO_2$, silicon nitride deposited by a low-pressure chemical vapor phase epitaxy, or the like. A (100) substrate is used as the silicon plate 120. Patterning of the mask layers 150 is performed by photolithography, as illustrated in FIG. 15A. An opening having a width $W_a$ is formed on an upper surface of the substrate 120, and two openings each having a width $W_b$ are formed on a lower surface of the substrate 120. A stripe portion of the mask layer 150 between the two openings having the width $W_b$ extends along a central longitudinal line of the opening having the width $W_a$. The width W, is approximately set to the width of an uppermost opening of each of the V-shaped torsion springs 128 and 129, and the width of the stripe portion of the mask layer 150 between the two openings having the width $W_b$ is approximately set to the width of a lowermost portion of each of the V-shaped torsion springs 128 and 129.

Figure 15B:
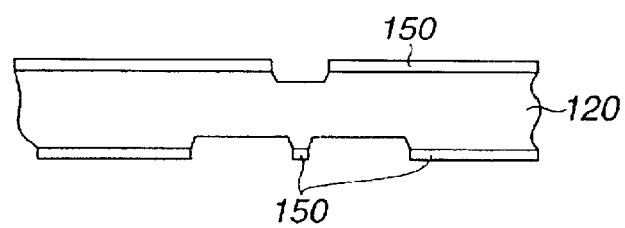
Figure 15C:
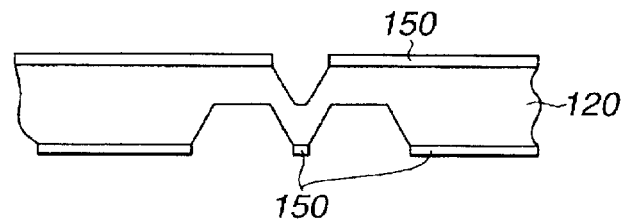

Etching is then performed from both surfaces of the single crystal silicon thin plate 120 by using an anisotropic etching alkaline solution, such as KOH. The anisotropic etching of the silicon proceeds fast on its (100) face, while slowly on its (111) face. Therefore, the etching initially proceeds such that an etched opening becomes narrower, as illustrated in FIGS. 15B and 15C. Here, side surfaces of etched portions are smooth (111) faces.

Figure 14:
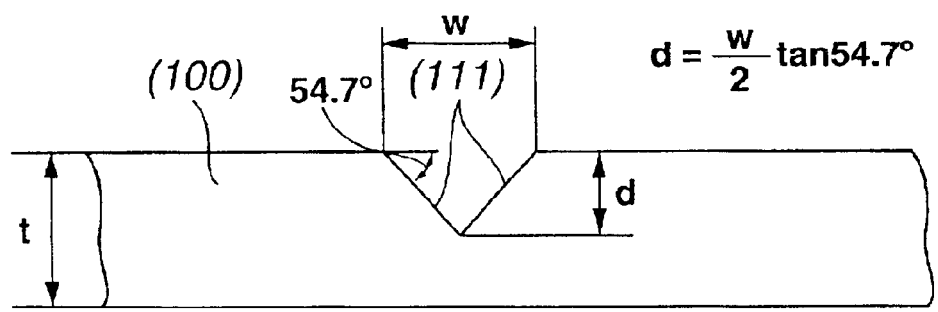
FIG. 14 is a cross-sectional view illustrating an anisotropic etching of a silicon substrate.
Figure 15D:
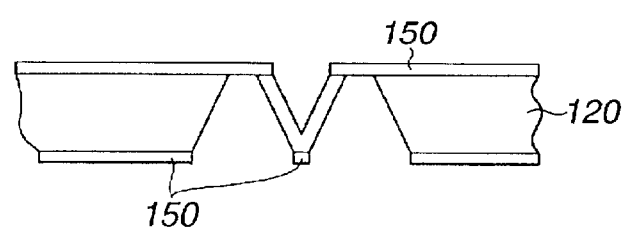

As illustrated in FIG. 15D, the etching in the openings having the width $W_b$ advances until the substrate 120 having a thickness t is penetrated, while the etching in the opening having the width $W_a$ stops before the substrate 120 is penetrated and lowermost portions of the V-shaped torsion springs 128 and 129 are formed. Since an angle between the (111) face and the (100) face is 54.7 degrees as illustrated in FIG. 14, the relationship between a width w and a depth d of a V-shaped groove satisfies d=(w/2)tan 54.7°. Accordingly, in this embodiment, relationships of $W_a$<2t/tan 54.7° and $W_b$>2t/tan 54.7° are established such that the V-shaped torsion springs 128 and 129 can be formed as discussed above. Here, t is the thickness of the silicon thin plate 120.

As described above, in the etching from the above surface, all the faces reach (111) faces before the substrate 120 is penetrated, and the etching stops such that the V-shaped groove is formed. In the etching from the bottom surface, the etching proceeds until the substrate 120 is penetrated, and stops at the mask layer 150.

Figure 11A:
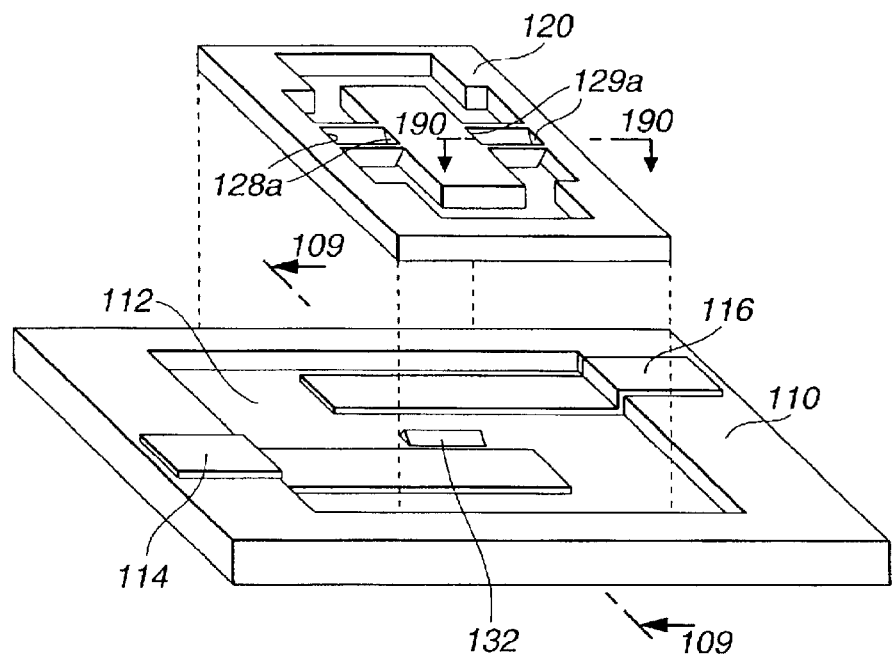
FIG. 11A is a perspective view illustrating the disassembled structure of the first embodiment.
Figure 11B:
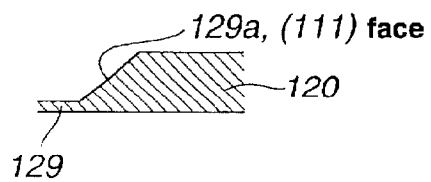
FIG. 11B is a cross-sectional view illustrating a torsion spring of the first embodiment taken along the line 190 of FIG. 11A.

At this stage, the mask layer 150 on the lower surface is patterned such that other etched penetrating portions can be formed around the mirror 130. The V-shaped torsion springs 128 and 129 are hard to break since the (111) face is smoothly formed with high precision. Further, faces 128a and 129a (see FIG. 11A) in the V-shaped grooves at root portions of the torsion springs 128 and 129 formed by the anisotropic etching are also (111) slant faces, as illustrated in FIG. 11B. Hence, stress concentration thereto can be reduced, leading to increases in reliability of the torsion spring and a light deflection angle of the mirror 130.

After the above-discussed anisotropic etching, an isotropic etching using a gas or acid may be performed to round sharp wedge portions of the V-shaped grooves and angle portions of the torsion springs 128 and 129. The stress concentration thereto can also be moderated by this isotropic etching.

Figure 15E:
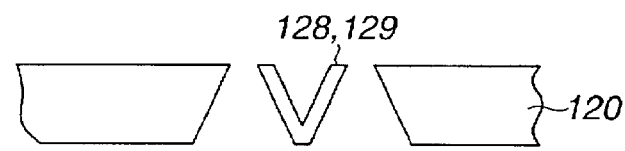

The mask layer 150 is then removed, as illustrated in FIG. 15E. And finally, the mirror 130 is cleaned, and a light reflective layer is formed on its surface.

The glass substrate 110 is processed in the following manner, as illustrated in FIGS. 16A to 16E.

Figure 16A:
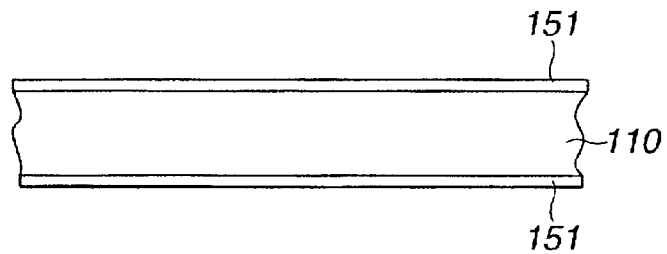
FIGS. 16A to 16E are cross-sectional views illustrating a method of processing a glass substrate of the first embodiment and other embodiments.

Mask layers 151 are formed on both surfaces of the glass substrate 151, respectively, as illustrated in FIG. 16A. The mask layer 150 is formed of a resist, or the like.

Figure 16B:
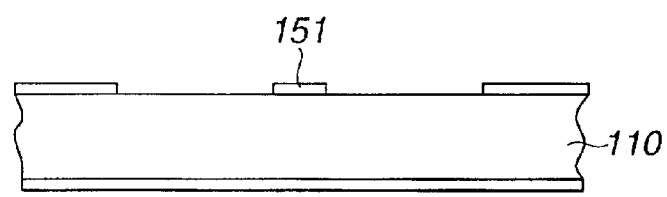
Figure 16C:
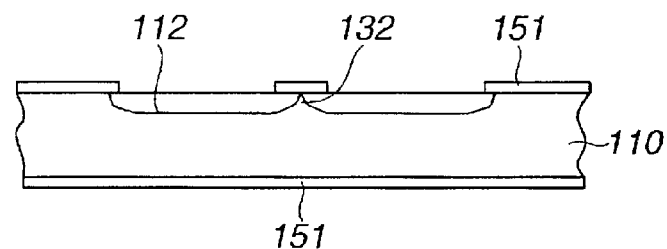

The mask layer 151 is patterned as illustrated in FIG. 16B. The patterning is conducted such that the mirror support 132 having a shape of the triangular prism and the recess 112 can be formed by etching. The etching is performed to form the recess 112 with a depth of 25 μm, as illustrated in FIG. 16C. The mirror support 132 is simultaneously formed.

Figure 16D:
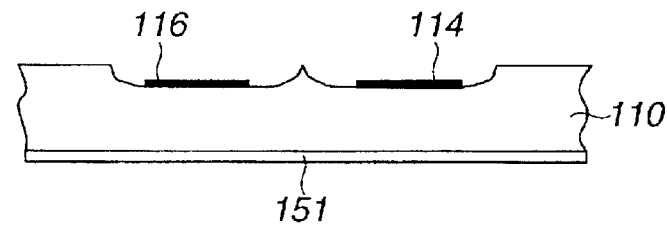

The mask layers 151 are then removed to form the driver electrodes 114 and 116 on the bottom of the recess 112, as illustrated in FIG. 16D.

Figure 1:
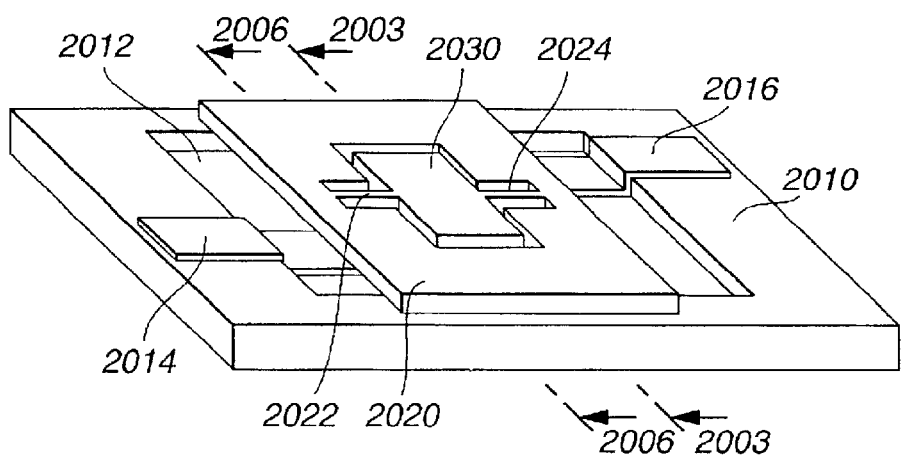
FIG. 1 is a perspective view illustrating a conventional optical deflector.
Figure 2:
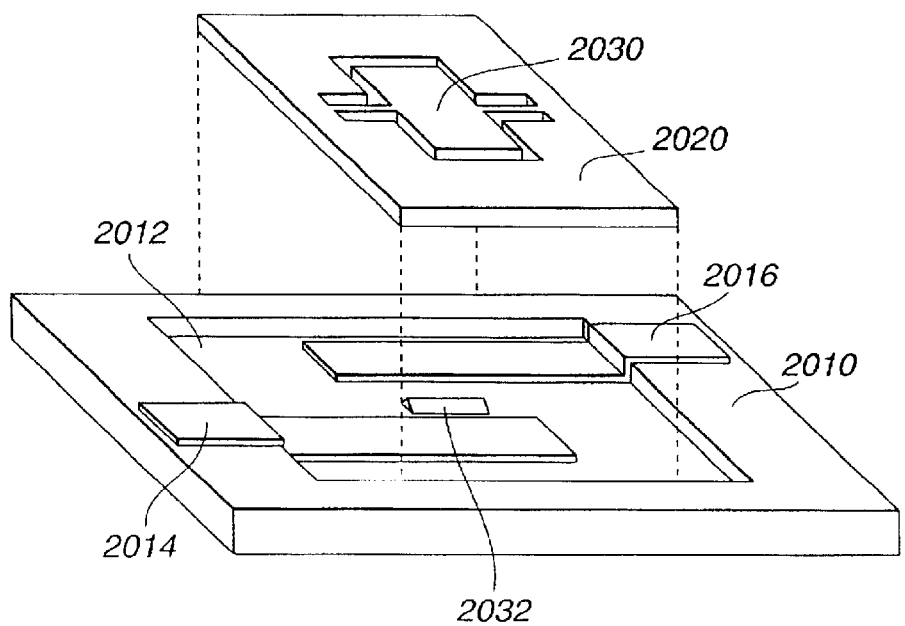
FIG. 2 is a perspective view illustrating the disassembled structure of the conventional optical deflector.
Figure 3:
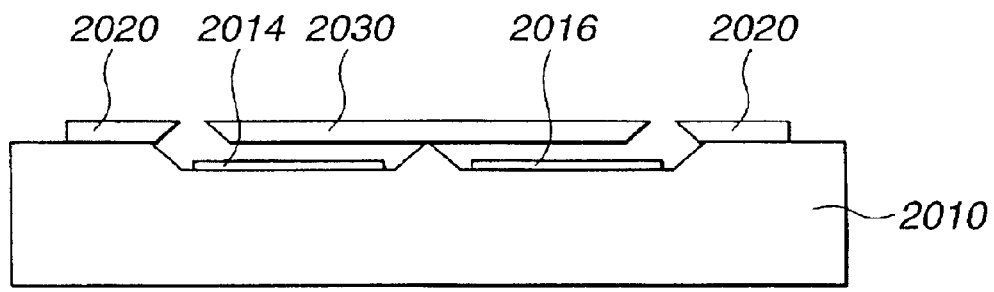
FIG. 3 is a cross-sectional view of the conventional optical deflector taken along the line 2003 of FIG. 1.
Figure 4:
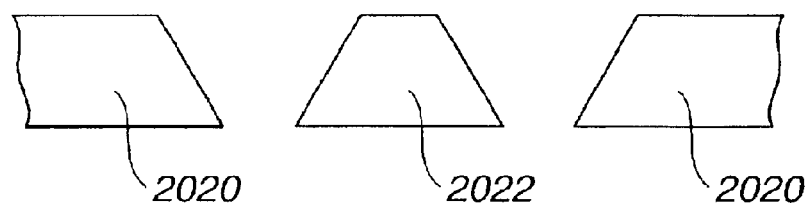
FIG. 4 is a cross-sectional view of a portion of a torsion bar in the conventional optical deflector taken along the line 2006 of FIG. 1.
Figure 5:
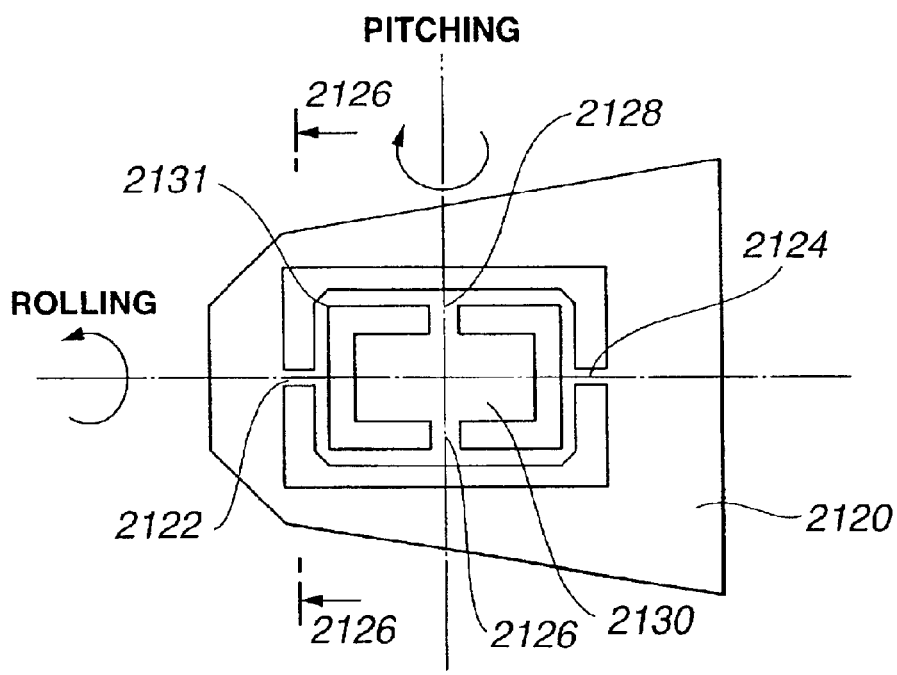
FIG. 5 is a plan view illustrating a conventional gimbal for a hard disc.
Figure 6:
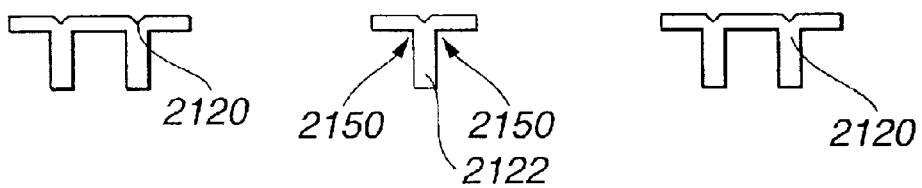
FIG. 6 is a cross-sectional view illustrating the conventional gimbal for a hard disc taken along the line 2106 of FIG. 5.
Figure 7A:
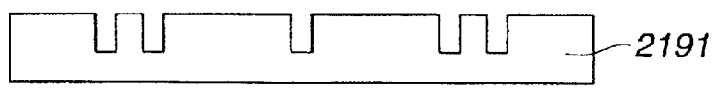
FIGS. 7A to 7E are cross-sectional views illustrating a method of fabricating the conventional gimbal for a hard disc.
Figure 7B:
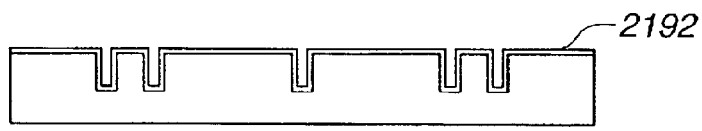
Figure 7C:
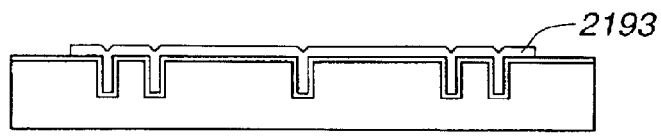
Figure 7D:
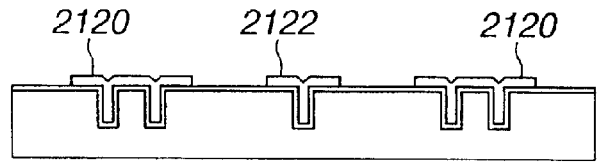
Figure 7E:
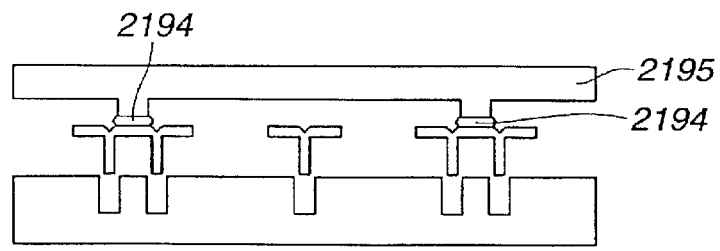
Figure 8:
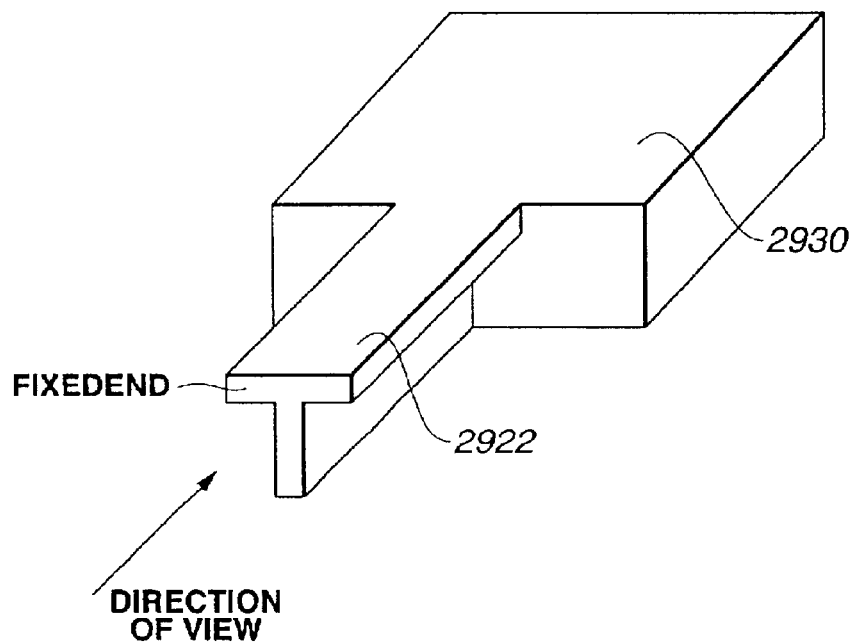
FIG. 8 is a perspective view illustrating a conventional T-shaped torsion bar.
Figure 9:
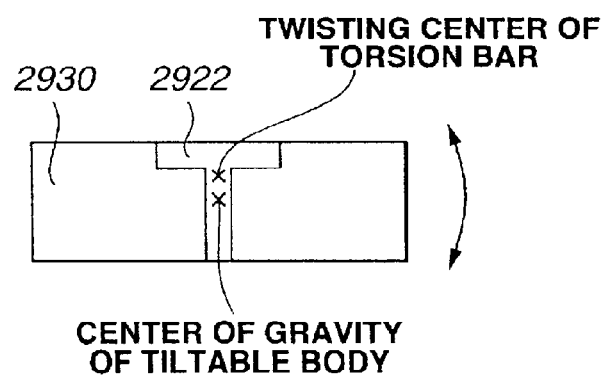
FIG. 9 is a cross-sectional view illustrating the conventional T-shaped torsion bar.
Figure 10:
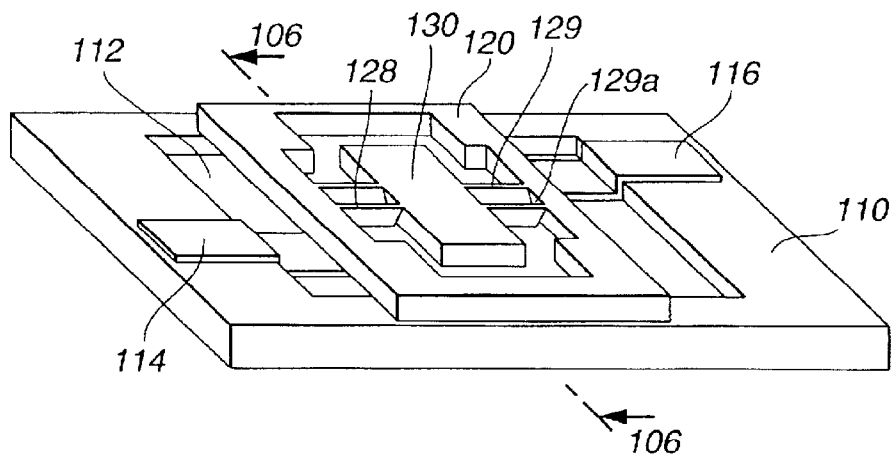
FIG. 10 is a perspective view illustrating an optical deflector of a first embodiment according to the present invention.
Figure 16E:
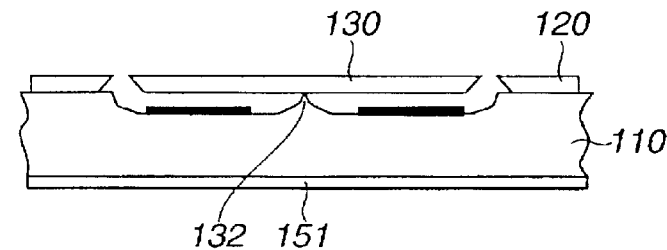

The silicon plate 120 and the glass substrate 110 are bonded as illustrated in FIG. 16E to construct the micro-optical scanner shown in FIG. 10.

As described in the foregoing, in accord with the fabrication method of this embodiment, the V-shaped torsion springs 128 and 129 can be fabricated by performing the anisotropic etching only once. The V-shaped torsion springs 128 and 129 of this embodiment illustrated in FIG. 13 can be readily twisted, but is hard to bend, similar to the conventional T-shaped torsion bar. Further, the cross section of the torsion springs 128 and 129 has two crossing portions slant to the flat plane of the tiltable body (the mirror 130), so that the torsion spring is hard to bend in directions perpendicular to and parallel to the flat plane of the tiltable body. Furthermore, in accord with this embodiment, since the torsion spring is formed of single crystal silicon, the micro-structure with a larger mechanical Q-value than that of poly-silicon can be achieved.

Further, in this embodiment having the torsion springs of single crystal material, the micro-optical scanner is hard to break, and has a large vibratory amplitude at the time of its resonance driving, and a high energy efficiency. The micro-structure of this embodiment can be readily fabricated by the above-discussed fabrication method.

Figure 17A:
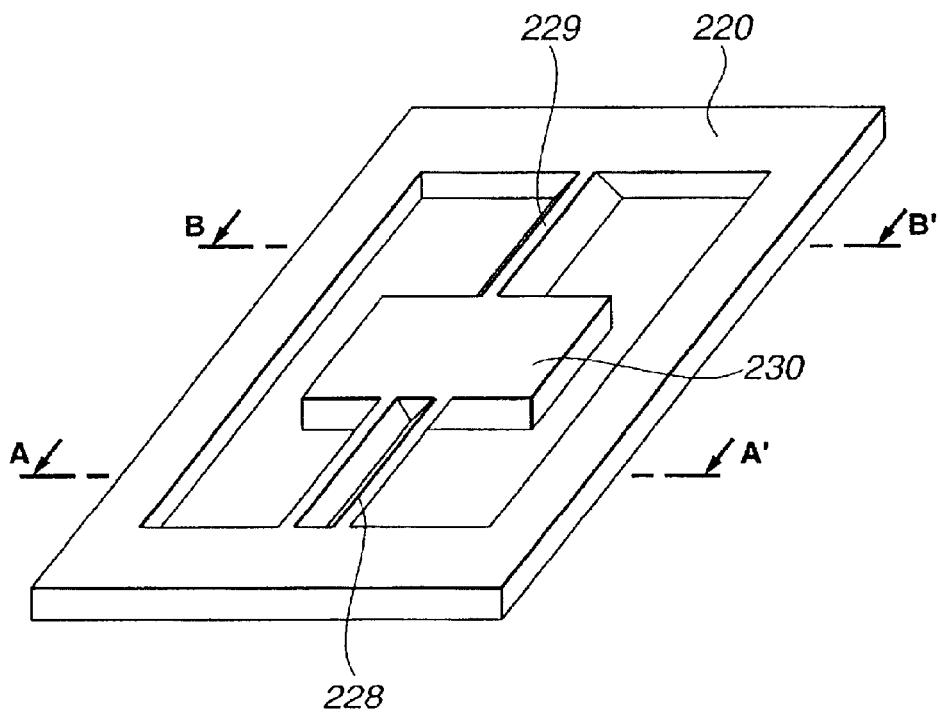
FIG. 17A is a perspective view illustrating an optical deflector of a modification of the first embodiment.
Figure 17B:
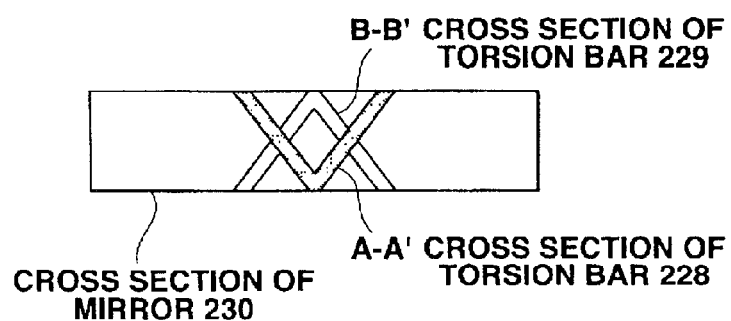
FIG. 17B is a cross-sectional view illustrating torsion springs of the modification of the first embodiment.
Figure 18:
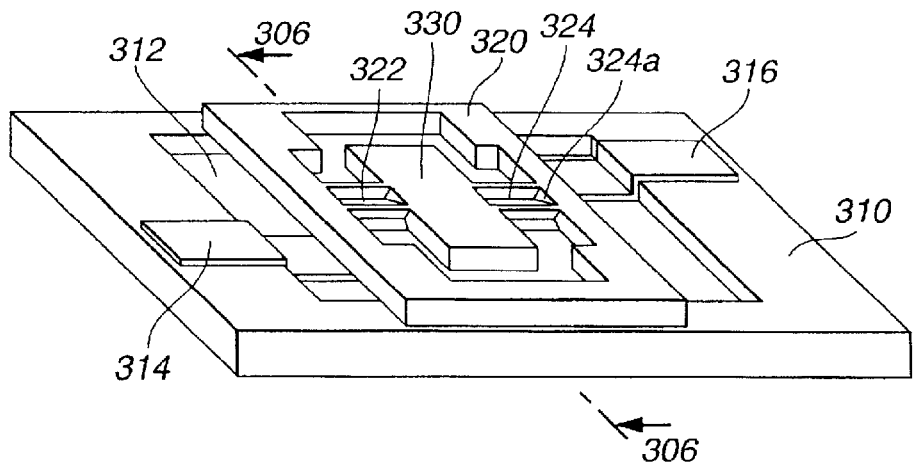
FIG. 18 is a perspective view illustrating an optical deflector of a second embodiment according to the present invention.

FIGS. 17A and 17B illustrate a modification of the first embodiment. In a micro-optical scanner of this modification, one torsion spring 228 has a V-shaped cross section defined by a surface of a silicon substrate 220 and (111) faces of silicon, and the other torsion spring 229 has a reversed-V-shaped cross section defined by these faces. Side surfaces of a mirror 230 with a light reflective surface and side surfaces of the frame silicon substrate 220 are exposed (111) faces of silicon, though these surfaces are depicted as perpendicular to the reflective surface in FIGS. 17A and 17B. This manner of depiction is the same in other similar figures.

Different from the first embodiment, cross sections of two torsion springs 228 and 229 in the micro-optical scanner of this modification differ from each other, as illustrated in FIG. 17B. This structure can provide a spring structure which can be readily twisted, but is hard to bend. Further, unnecessary modes of motion, such as bending vibrations, and adverse influences of external disturbances due to the structure of one of the torsion springs 228 and 229 can be offset by the structure of the other torsion spring. The driving stability can thus be improved.

More specifically, the A–A' cross section of the torsion spring 228 is symmetric with the B–B' cross section of the torsion spring 229 with respect to a substrate plane (i.e., a plane including the twisting longitudinal axis of the torsion springs 228 and 229 and parallel to the plane of the mirror 230), as illustrated in FIG. 17B. Further, the center of gravity of the mirror 230 is on the longitudinal axis of the torsion springs 228 and 229. Hence, the driving stability can be further improved.

The micro-optical scanner of this modification can be fabricated by processing a silicon substrate using the crystallographic anisotropic etching, like the first embodiment. The fabrication process shown in FIGS. 15A to 15E can be employed, but the mask layers 150 for forming the other torsion spring 229 are turned up-side-down from the pattern of FIG. 15A. Thus, the V-shaped and reversed-V-shaped torsion springs 228 and 229 can also be readily fabricated by performing the anisotropic etching only once.

In accord with this modification, there can be provided such a micro-optical scanner which can be readily fabricated and in which cross sections of two sets of torsion springs differ from each other, and adverse influences such as external disturbances caused by driving the torsion springs can be offset.

A second embodiment of a micro-optical scanner according to the present invention will be described with reference to FIG. 18, FIG. 19A, FIG. 19B, and FIG. 20. The cross-sectional view of FIG. 19A taken along a line 309 is the same as FIG. 12.

Figure 20:
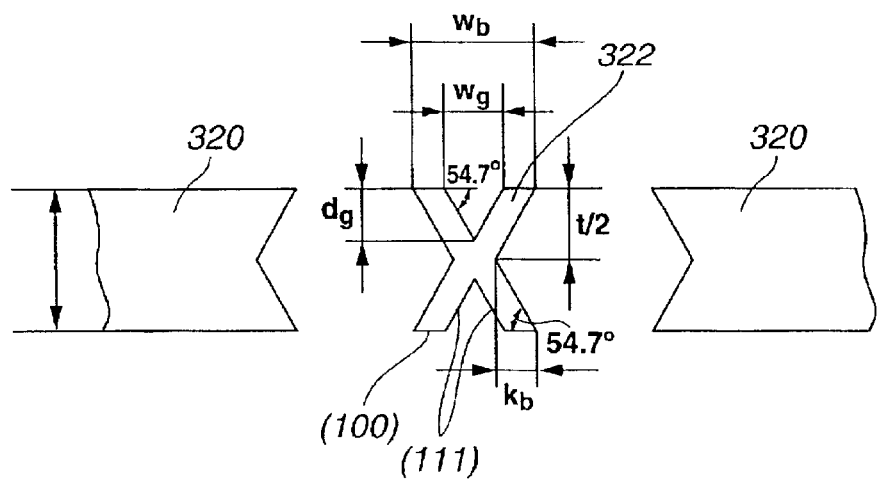
FIG. 20 is across-sectional view illustrating the torsion spring of the second embodiment taken along the line 306 of FIG. 18.

Also in the second embodiment of the micro-optical scanner, a recess 312 is formed on a glass substrate 310. A pair of driver electrodes 314 and 316 and a mirror support 332 of a triangular prism are arranged on the bottom of the recess 312. In a silicon plate 320, torsion springs 322 and 324 and a mirror 330 are integrally formed by bulk micromachining techniques. Each of the torsion springs 322 and 324 has a cross section of X-shape, as illustrated in FIG. 20. This shape is a dodecagonal shape with four internal angles of more than 180 degrees, is 180-degree rotationally symmetric, and has portions slant to the plane of the mirror 330.

The mirror 330 has a flat surface coated with a highly-reflective material, and is supported by the X-shaped torsion springs 322 and 324 such that the mirror 330 can be freely tilted about the twisting longitudinal axis of these springs. The silicon plate 320 is disposed opposingly to the glass substrate 310 such that a predetermined distance can be set between the mirror 330 and the driver electrodes 314 and 316. A bottom potion of the mirror 330 along the longitudinal axis of the torsion springs 322 and 324 is in contact with an apex portion of the mirror support 332. The mirror 330 can hence be tilted about the twisting longitudinal axis along that apex portion.

The single crystal silicon thin plate 320 is electrically grounded. Accordingly, the mirror 330 can be tilted about the twisting longitudinal axis by applying thereto an electrostatic force caused by alternately applying voltages to the driver electrodes 314 and 316.

A fabrication method of the optical scanner will be described with reference to FIGS. 22A to 22G. The process illustrated in FIGS. 16A to 16E is also used in this fabrication method. FIGS. 22A to 22G are cross-sectional views taken along the line 306 of FIG. 18, and FIGS. 16A to 16E are cross-sectional views taken along the line 309 of FIG. 19A.

The silicon plate 320 is processed in the following manner, as illustrated in FIGS. 22A to 22G.

Figure 21:
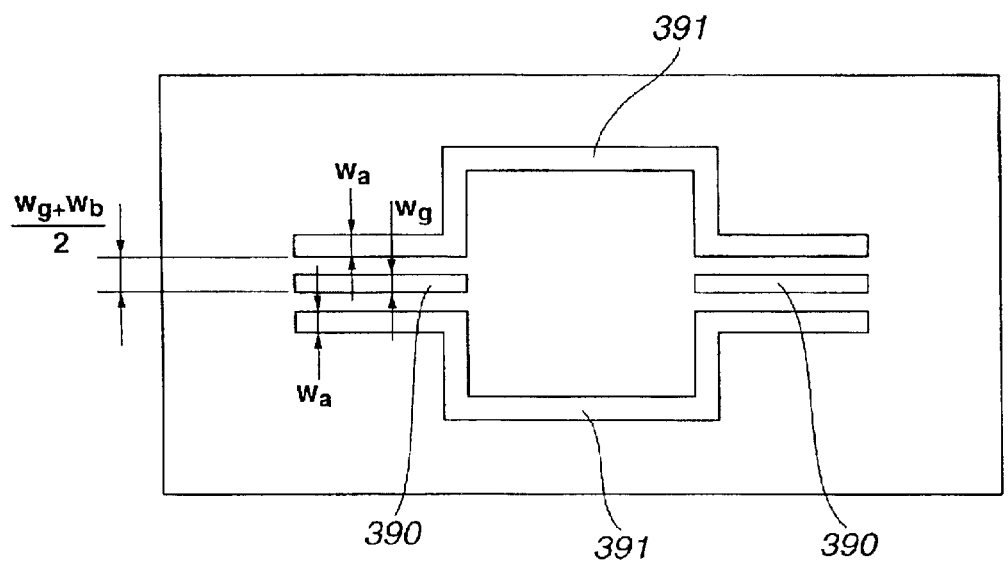
FIG. 21 is a plan view illustrating the second embodiment.

Mask layers 350 are formed on both surfaces of the silicon plate 320, respectively. The mask layer 350 is formed of $SiO_2$, silicon nitride deposited by the low-pressure chemical vapor phase epitaxy, or the like. A (100) substrate is used as the silicon plate 320. Patterning of the mask layers 350 is performed by photolithography, as illustrated in FIG. 22A. The mask pattern obtained by this patterning is shown in FIG. 21. In the mask pattern illustrated in FIG. 21, openings 391 each having a width $W_a$ are formed along the torsion springs 322 and 324 and the mirror 330, and openings 390 each having a width $W_g$ are formed along longitudinal axes of the torsion springs 322 and 324 each having a width $W_b$.

Etching is then performed from both surfaces of the single crystal silicon thin plate 320 by using an anisotropic etching alkaline solution, such as KOH. The anisotropic etching of the silicon proceeds fast on its (100) face, while slowly on its (111) face. Therefore, the etching initially proceeds such that an etched opening becomes narrower, as illustrated in FIG. 22B.

In etching through the opening 390 with a width $W_g$, all the faces become (111) faces before the etched opening reaches a center of the substrate 320, and the etching stops such that the V-shaped groove (having a depth $d_g$ and a width $W_g$ as illustrated in FIG. 20) is formed. In etching through the openings 391 with a width $W_a$, the etching proceeds until the substrate 320 is penetrated, as illustrated in FIG. 22C.

Since the angle between the (111) face and the (100) face is 54.7 degrees as illustrated in FIG. 14, the relationship between the width w and the depth d of a V-shaped groove satisfies d=(w/2)tan 54.7°. Accordingly, relationships of $W_g<2t/\tan 54.7°$ and $W_a>2t/\tan 54.7°$ are established in this embodiment.

After grooves from the upper and lower openings 391 meet, etching proceeds sideward, as illustrated in FIGS. 22D and 22E.

Figure 19A:
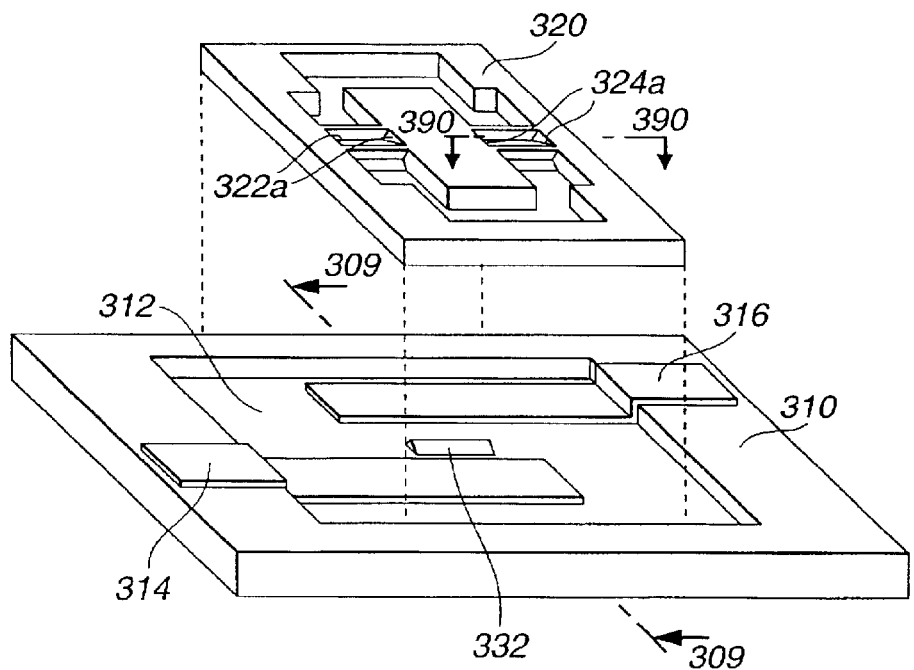
FIG. 19A is a perspective view illustrating the disassembled structure of the second embodiment.
Figure 19B:
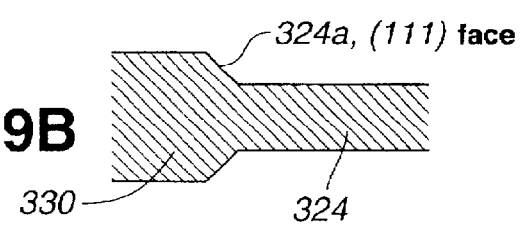
FIG. 19B is a cross-sectional view illustrating a torsion spring of the second embodiment taken along the line 390 of FIG. 19A.

The etching stops when the (111) faces are reached. The X-shaped torsion springs 322 and 324 are thus formed as illustrated in FIG. 22F. Here, the X-shaped torsion springs 322 and 324 are hard to break since the (111) face is smoothly formed with high precision. Further, faces 322a and 324a (see FIG. 19A) of the V-shaped grooves at root portions of the torsion springs 322 and 324 formed by the anisotropic etching are (111) slant faces, as illustrated in FIG. 19B. Hence, stress concentration thereto can be reduced, leading to increases in reliability of the torsion spring 322 and 324 and a light deflection angle of the mirror 330.

After the above-discussed anisotropic etching, isotropic etching using a gas or acid may be performed to round sharp wedge portions of the V-shaped grooves and angle portions of the torsion springs 322 and 324. The stress concentration thereto can also be moderated by this isotropic etching.

The mask layer 350 is then removed as illustrated in FIG. 22G. And finally, the mirror 330 is cleaned, and a light reflective layer is deposited on its surface.

The glass substrate 310 is processed by the same manner as that of the first embodiment, as illustrated in FIGS. 16A to 16E.

Figure 23A:
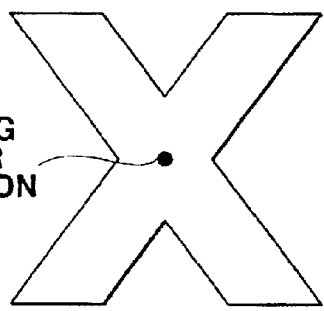
FIGS. 23A to 23C are cross-sectional views illustrating the torsion spring of the second embodiment.

As described in the foregoing, in accord with the fabrication method of this embodiment, the X-shaped torsion springs 322 and 324 can be fabricated by performing anisotropic etching only once. Each of the thus-fabricated torsion springs 322 and 324 with the X-shaped cross section as illustrated in FIG. 20 has the feature that its geometrical moment of inertia I is large while its polar moment of inertia j is relatively small. Further, since its cross sectional shape is rotationally symmetric, such a micro-structure can be provided, in which no vibratory forces perpendicular to the twisting longitudinal axis occurs at the tilting time, and the center of gravity of the tiltable body can be readily set on the twisting center of the torsion spring as illustrated in FIG. 23A.

Figure 23B:
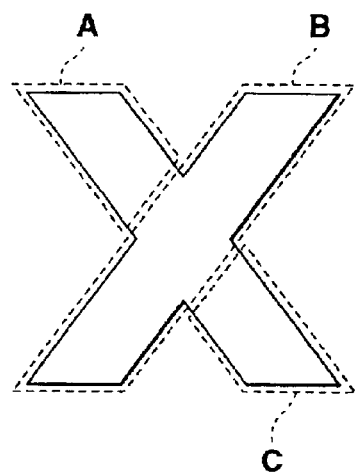
Figure 23C:
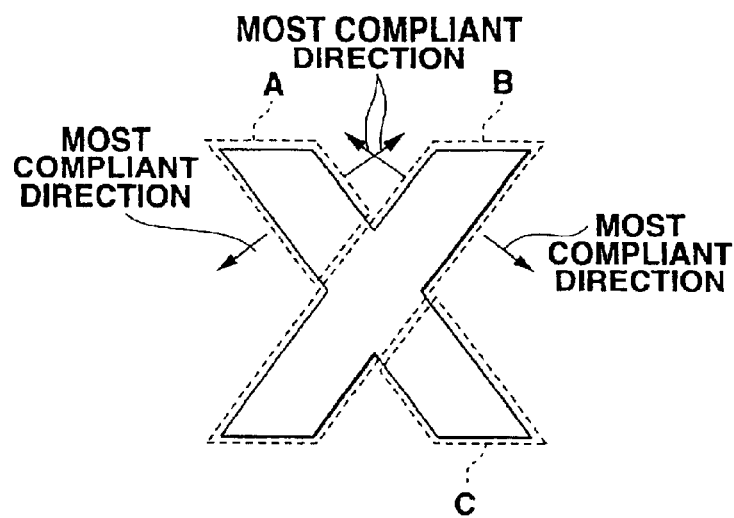

Furthermore, the cross section of each of the torsion springs 322 and 324 has crossing portions slant to the flat plane of the tiltable body (the mirror 330), and is composed of a plurality of planar portions, as illustrated by dashed lines A, B and C in FIGS. 23B and 23C, so that the torsion spring is hard to bend in directions perpendicular to and parallel with the flat plane of the tiltable body. Those torsion springs can be readily twisted about the twisting longitudinal axis, but are hard to bend in directions perpendicular to this axis, because most compliant directions of planar portions thereof intersect as illustrated in FIG. 23C and a relatively thick portion exists in every most compliant direction to prevent the bending in this direction.

Also in this embodiment, since the torsion spring is formed of single crystal silicon, a micro-structure with a larger mechanical Q-value than that of poly-silicon can be achieved. Further, in this embodiment having the torsion springs of single crystal material, the micro-structure is hard to break, can be made compact, and has a large vibration amplitude and a high energy efficiency at the time of its resonance driving. The micro-structure of this embodiment can be readily fabricated by the above-discussed fabrication method.

Figure 24A:
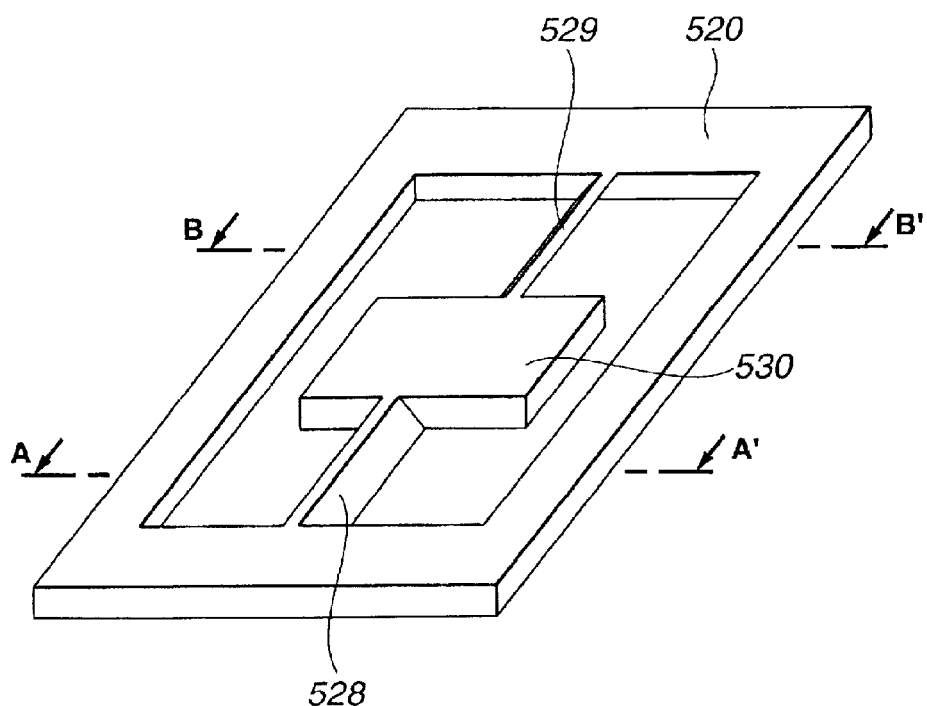
FIG. 24A is a perspective view illustrating an optical deflector of a modification of the second embodiment.

FIG. 24A illustrates a modification of the second embodiment. In a micro-optical scanner of this modification, each of torsion springs or bars 528 and 529 has a planar cross section defined by surfaces of a single crystal (100) substrate 520 and (111) faces of silicon.

Figure 24B:
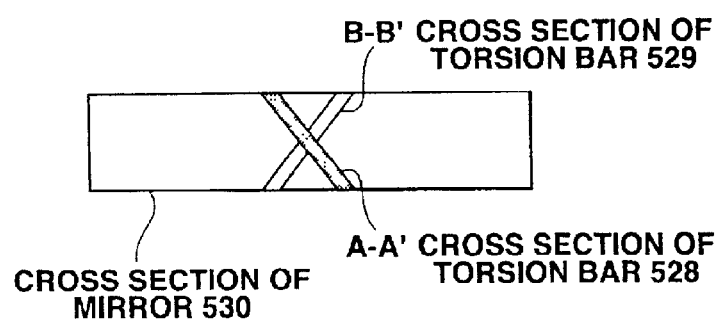
FIG. 24B is a cross-sectional view illustrating torsion springs of the modification of the second embodiment.

Different from the second embodiment, cross sections of two torsion springs 528 and 529 in the micro-optical scanner of this modification differ from each other, as illustrated in FIG. 24B. This structure can provide a spring structure which can be readily twisted, but is hard to bend. Further, unnecessary modes of motion, such as bending vibrations, and adverse influences of external disturbances caused by the structure of one of the torsion springs 528 and 529 can be offset by the structure of the other. The driving stability can thus be improved.

More specifically, the A–A' cross section of the torsion spring 528 is symmetric with the B–B' cross section of the torsion spring 528 with respect to the plane of the substrate 520 (i.e., a plane of a mirror 530, or more accurately a plane including the twisting longitudinal axis of the torsion springs 528 and 529 and parallel to the plane of the mirror 530), as illustrated in FIG. 24B. Further, the center of gravity of the mirror 530 is on the longitudinal axis of the torsion springs 528 and 529. Hence, the driving stability can be further improved.

The micro-optical scanner of this modification can be fabricated by processing a silicon substrate using the crystallographic anisotropic etching, like the second embodiment. The following fabrication process shown in FIGS. 25A to 25E can be employed.

Figure 25A:
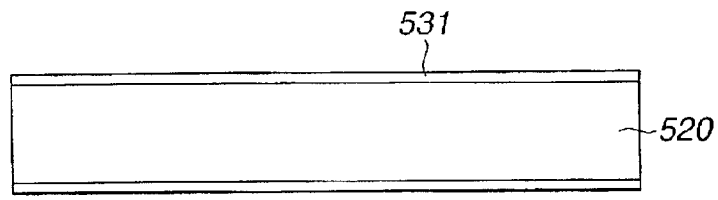
FIGS. 25A to 25E are cross-sectional views illustrating a method of processing a single crystal silicon thin plate of the modification of the second embodiment.
Figure 25B:
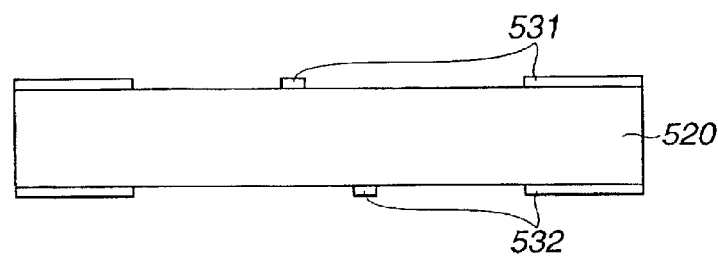

Initially, mask layers 531 and 532 are formed on both surfaces of the (100) silicon plate 520, respectively, as illustrated in FIG. 25A. The mask layer 531 and 532 are formed of silicon nitride deposited by the low-pressure chemical vapor phase epitaxy. Patterning of the mask layers 531 and 532 is performed by photolithography and dry etching using a $CH_4$ gas, as illustrated in FIG. 25B. On both surfaces of the substrate 520, each of the mask layer 531 and 532 is left with a width equal to the width of the torsion springs 528 and 529, and these left portions of the mask layers are caused to shift relatively to each other, corresponding to the inclination of each of the torsion springs 528 and 529.

Figure 25C:
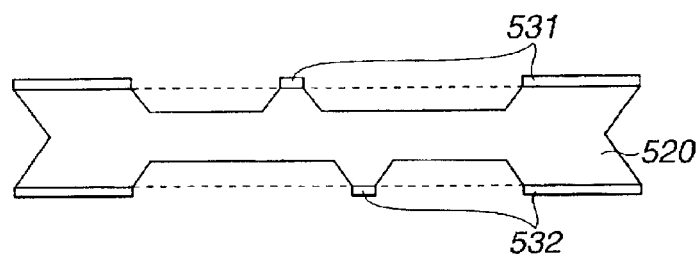
Figure 25D:
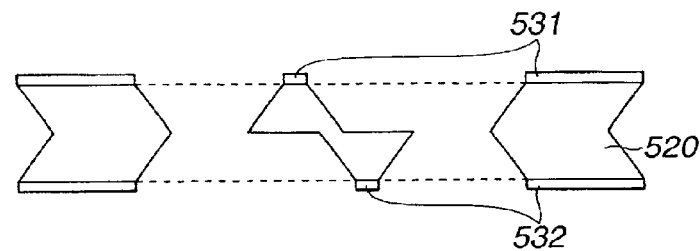

Crystallographic anisotropic etching is then performed from both surfaces of the single crystal silicon substrate 520 by using a 30% KOH solution heated to 100° C., as illustrated in FIG. 25C. The anisotropic etching of the silicon proceede such that the substrate 520 is penetrated, as illustrated in FIG. 25D. Here, etching directions are as illustrated in FIG. 25D.

Figure 25E:
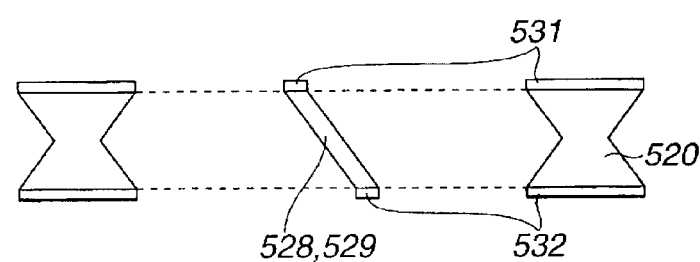

The etching is further advanced such that the torsion springs 528 and 529 of leaf springs with side surfaces of Si (111) faces are formed, as illustrated in FIG. 25E. Thus, the torsion springs 528 and 529 on opposite sides of the mirror 530 are simultaneously formed. The upper and lower patterns of the mask layers 531 and 532 for forming the torsion springs 528 and 529 are reversed relative to each other.

The mask layers 531 and 532 may be removed. Further, the mirror 530 may be coated with a reflective layer. As described in the foregoing, in accord with the fabrication method of this modification, the leaf-shaped torsion bars 528 and 529 can be fabricated by performing anisotropic etching only once.

In accord with this modification, the following micro-optical scanner can be provided. In this scanner, each of two sets of the torsion springs 528 and 529 consists of a simple leaf-shaped bar, the fabrication process is simple, and cross sections of the two torsion bars 528 and 529 differ from each other, so that the spring structure can be readily twisted, but is hard to bend. Further, adverse influences of external disturbances and the like caused by the structure of one of the torsion springs 528 and 529 can be offset by the structure of the other. Moreover, the center of gravity of the two torsion bars 528 and 529 can be readily brought on the twisting longitudinal axis. Thus, the driving can be readily stabilized, no stress-concentration portions of the torsion bars 528 and 529 exist, and the structure is hard to break.

Figure 26:
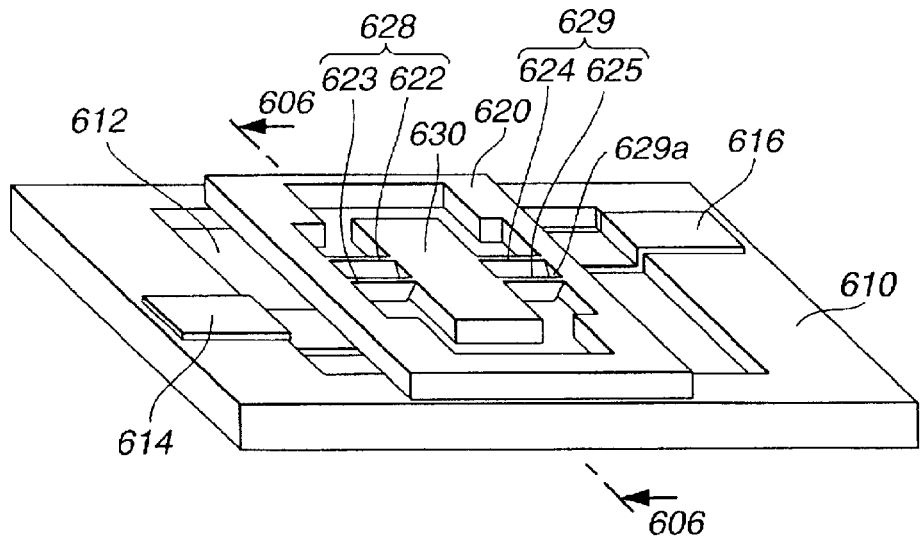
FIG. 26 is a perspective view illustrating an optical deflector of a third embodiment according to the present invention.
Figure 27A:
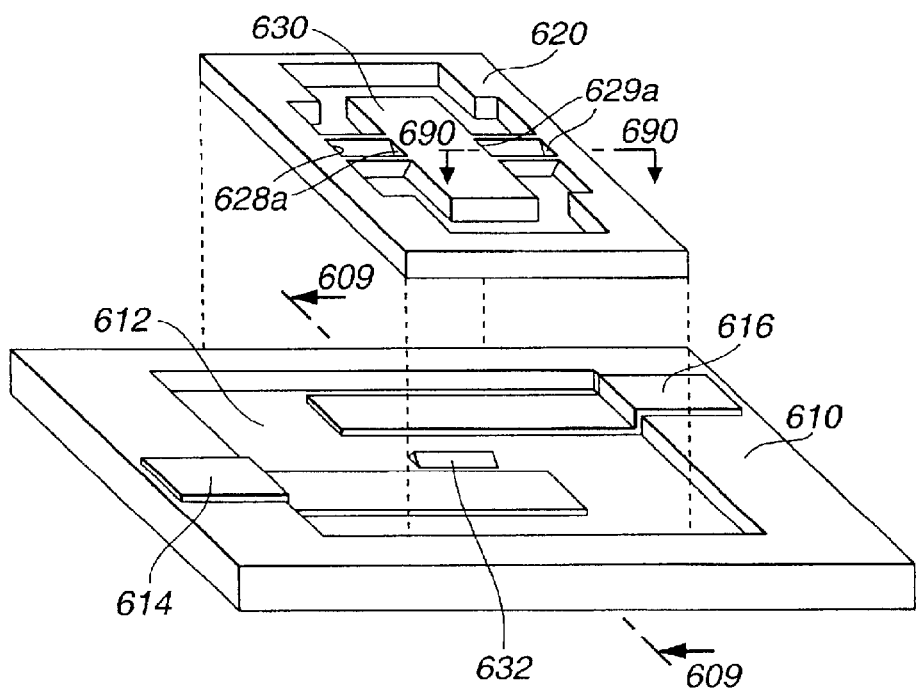
FIG. 27A is a perspective view illustrating the disassembled structure of the third embodiment.
Figure 28:
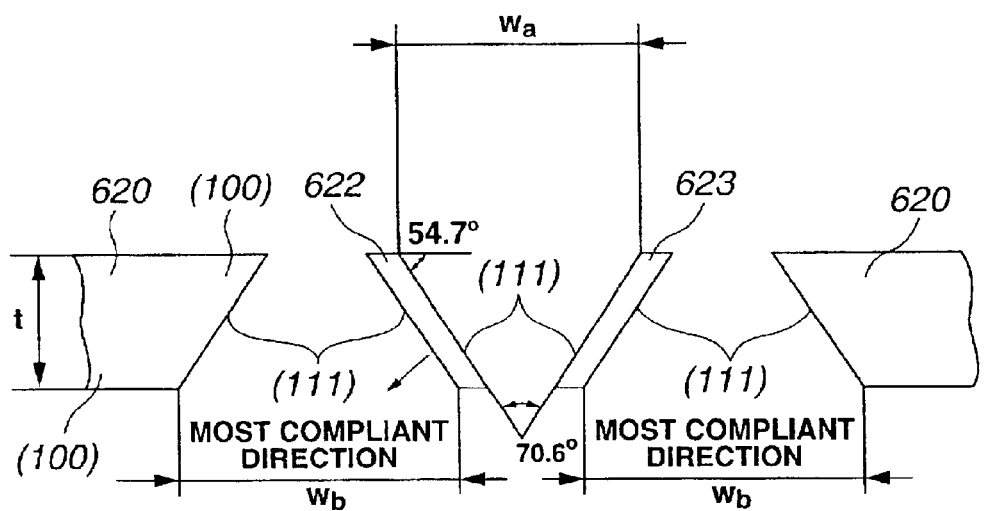
FIG. 28 is across-sectional view illustrating the torsion spring of the third embodiment taken along the line 606 of FIG. 26.

FIG. 26 is a perspective view illustrating a third embodiment of a micro-optical scanner according to the present invention. FIG. 27A is a view illustrating a disassembled structure of the micro-optical scanner to show its internal structure. FIG. 28 is a cross-sectional view of FIG. 26 taken along a line 606, illustrating cross sections of a single crystal thin plate 620 and torsion springs 628 and 629. The cross-sectional view of FIG. 27A taken along a line 609 is the same as FIG. 12.

Also in the third embodiment of the micro-optical scanner, a recess 612 is formed on a glass substrate 610. A pair of driver electrodes 614 and 616 and a mirror support 632 of a triangular prism are arranged on the bottom of the recess 612. In the silicon plate 620, torsion springs 628 and 629 and a mirror 630 are integrally formed by bulk micromachining techniques. Each of two sets of the torsion springs 628 and 629 consists of a pair of leaf-shaped torsion bars 622 and 623; 624 and 625, and its cross section has a broken V-shape, as illustrated in FIG. 28.

The mirror 630 has a flat surface coated with a highly-reflective material, and is supported by two sets of the torsion springs 628 and 629 such that the mirror 630 can be freely tilted about the twisting longitudinal axis of these springs. The silicon plate 620 is disposed oppositely to the glass substrate 610 such that a predetermined distance can be set between the mirror 630 and the driver electrodes 614 and 616. A bottom potion of the mirror 630 along the longitudinal axis of the torsion springs 628 and 629 is in contact with an apex portion of the mirror support 632. The mirror 630 can hence be tilted about the twisting longitudinal axis along that apex portion.

The silicon thin plate 620 is electrically grounded. Accordingly, the mirror 630 can be tilted about the twisting longitudinal axis by applying thereto an electrostatic force caused by alternately applying voltages to the driver electrodes 614 and 616.

A fabrication method of the optical scanner of the third embodiment will be described with reference to FIGS. 29A to 29E. The process illustrated in FIGS. 16A to 16E is also used in this fabrication method. FIGS. 29A to 29E are cross-sectional views taken along the line 606 of FIG. 26, and FIGS. 16A to 16E are cross-sectional views taken along the line 609 of FIG. 27A.

The silicon plate 620 is processed in the following manner, as illustrated in FIGS. 29A to 29E.

Figure 29A:
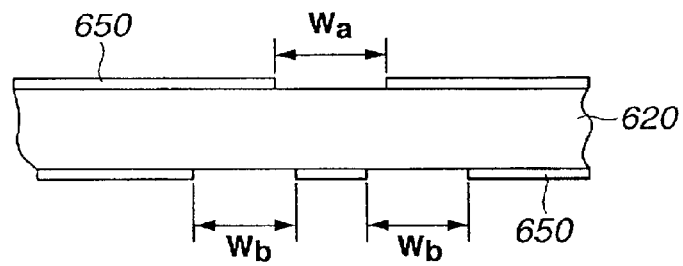
FIGS. 29A to 29E are cross-sectional views illustrating a method of processing a single crystal silicon thin plate of the third embodiment.

Mask layers 650 are formed on both surfaces of the silicon plate 620, respectively. The mask layer 650 is formed of $SiO_2$, silicon nitride deposited by the low-pressure chemical vapor phase epitaxy, or the like. A (100) substrate is used as the silicon plate 620. Patterning of the mask layers 650 is performed by photolithography, as illustrated in FIG. 29A. The mask pattern obtained by this patterning is shown in FIG. 29A. In the mask pattern at portions of the torsion springs 628 and 629; a stripe-shaped opening having a width $W_a$ is formed on an upper surface of the substrate 620, and two stripe-shaped openings each having a width $W_b$ are formed on a lower surface of the substrate 620. A pair of the stripe-shaped openings with a width $W_b$ are formed with a stripe-shaped mask layer in-between, and the stripe-shaped opening with a width $W_a$ is formed on the upper surface, corresponding to the above stripe-shaped mask layer on the lower surface. The width $W_a$ is approximately set to an uppermost spacing between the leaf-shaped torsion springs 622 and 623; 624 and 625, and the width of stripe-shaped mask layer 650 between the two openings having a width $W_b$ is approximately set to a lowermost spacing between the leaf-shaped torsion springs 622 and 623; 624 and 625. In the mask pattern on the upper surface of the substrate 620, openings with an appropriate width are also formed around the mirror 630.

Figure 29B:
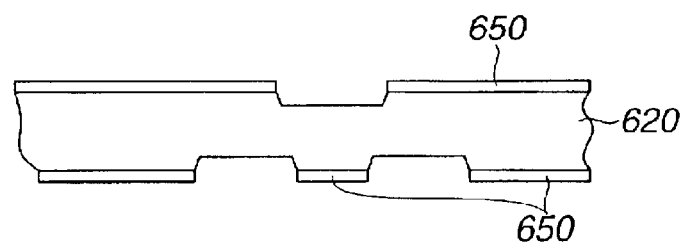
Figure 29C:
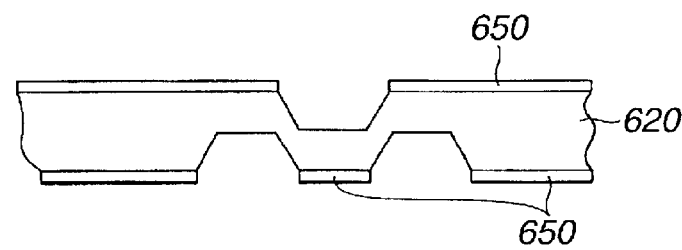

Etching is then performed from both surfaces of the single crystal silicon thin plate 620 by using an anisotropic etching alkaline solution, such as KOH. The anisotropic etching of the silicon proceeds fast on its (100) face, while slowly on its (111) face. Therefore, the etching initially proceeds such that an etched groove becomes narrower, as illustrated in FIGS. 29B and 29C.

Figure 29D:
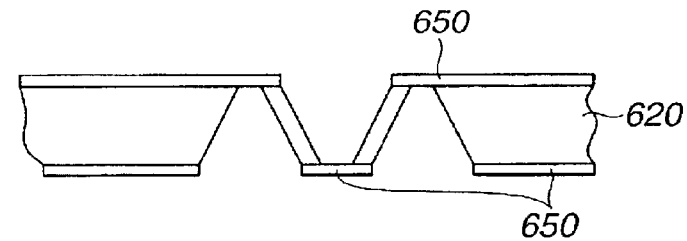

The etching proceeds until the substrate 620 is penetrated from both surfaces, and stops at the mask layer 650, as illustrated in FIG. 29D. Since the angle between the (111) face and the (100) face of silicon is 54.7 degrees as illustrated in FIG. 14, the relationship between the width w and the depth d of a V-shaped groove satisfies d=(w/2)tan 54.7°. Accordingly, relationships of $W_a$, $W_b > 2t/\tan 54.7°$ need to be established to penetrate the substrate 620 in this embodiment.

Figure 27B:
FIG. 27B is a cross-sectional view illustrating a torsion spring of the third embodiment taken along the line 690 of FIG. 27A.

The broken-V-shaped torsion springs 628 and 629 are hard to break since the (111) face is smoothly formed with high precision. Further, faces 628a and 629a (see FIG. 27A) of the V-shaped grooves at root portions of the torsion springs 628 and 629 formed by the anisotropic etching are (111) slant faces, as illustrated in FIG. 27B which is a cross-sectional view of the silicon plate 620 taken along a line 690 of FIG. 27A. Hence, stress concentration thereto can be reduced, leading to increases in reliability of the torsion springs and a light deflection angle of the mirror.

After the above-discussed anisotropic etching, isotropic etching using a gas or acid may be performed to round angle portions of the torsion springs. The stress concentration thereto can also be moderated by this isotropic etching.

Figure 29E:
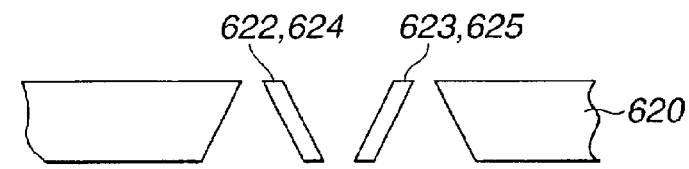

The mask layer 650 is then removed as illustrated in FIG. 29E. And finally, the mirror 630 is cleaned, and a light reflective layer is deposited on its surface.

The glass substrate 610 is processed by the same manner as that of the first embodiment, as illustrated in FIGS. 16A to 16E.

As described in the foregoing, in accord with the fabrication method of this embodiment, the broken-V-shaped torsion springs 622 and 623; 624 and 625 can be fabricated by performing the anisotropic etching only once.

As illustrated in FIG. 28, two planar torsion bars 622 and 623; 624 and 625 of each of the torsion springs 628 and 629 in the optical scanner of this embodiment form an angle of 70.6° therebetween. Thus, since most compliant directions (directions in which the flexural rigidity is lowest) of the planar torsion bars 622 and 623; 624 and 625 are combined in a non-parallel relationship, the entire structure of the torsion bars can have a high flexural rigidity. Further, the cross section of each of the torsion springs 628 and 629 has crossing portions slant to the flat plane of the tiltable plane body (the mirror 630), so that the torsion spring is hard to bend in directions perpendicular to and parallel with the flat plane of the tiltable body.

Figure 54:
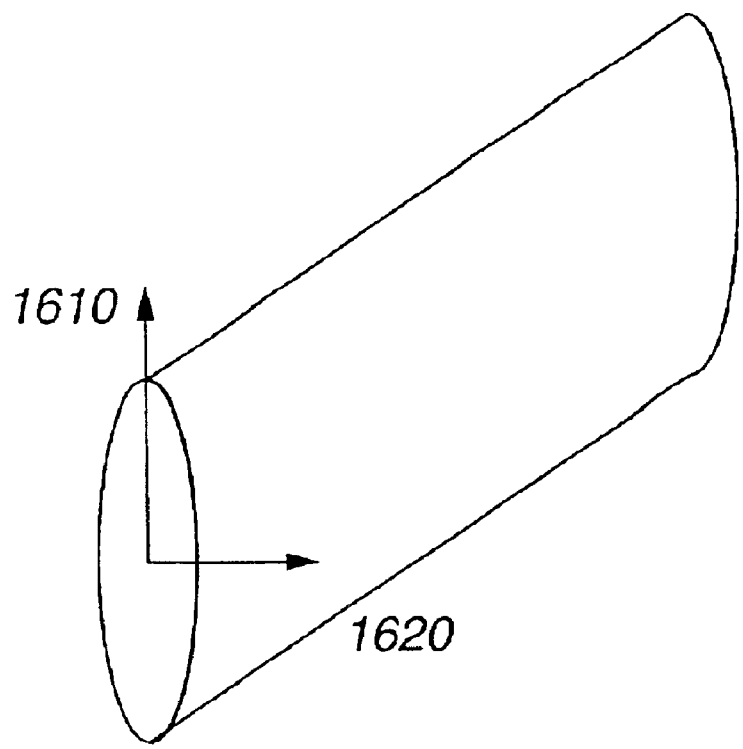
FIG. 54 is a perspective view of a planar torsion bar illustrating characteristics of the torsion spring of the present invention.

In FIG. 54, least compliant direction 1610 (a direction in which the geometrical moment of inertia I is maximum) and most compliant direction 1620 (a direction in which the geometrical moment of inertia I is minimum) of a planar torsion bar are illustrated.

In accord with this embodiment, since no great stress concentration occurs in contrast to the case of the T-shaped torsion bar, a micro-structure harder to break can be achieved, where the same torsion spring with equal torsion spring constant and equal length is considered. Further, in accord with this embodiment, a micro-structure capable of being decreased in size can be achieved compared to the case of the T-shaped torsion bar, where the same torsion spring with equal permissible torsional angle is considered. Also in this embodiment, since the torsion spring is formed of single crystal silicon, a micro-structure with a larger mechanical Q-value than that of poly-silicon can be achieved.

Further, in this embodiment, the micro-optical scanner is hard to break, can be made compact, and has a large vibratory amplitude and a high energy efficiency at the time of its resonance driving. The micro-structure of this embodiment can be readily fabricated by the above-discussed fabrication method of this embodiment.

Figure 30A:
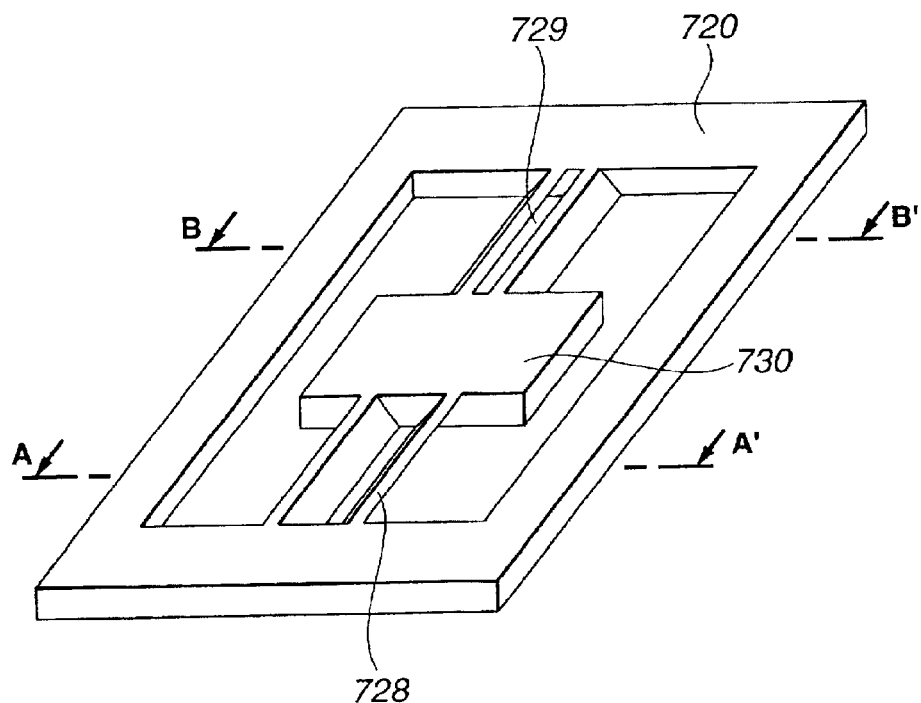
FIG. 30A is a perspective view illustrating an optical deflector of a modification of the third embodiment.

FIG. 30A illustrates a modification of the third embodiment. In a micro-optical scanner of this modification, each of two sets of torsion springs 728 and 729 has a planar cross section defined by surfaces of a silicon substrate frame 720 and (111) faces of silicon, and each of the torsion springs 728 and 729 consists of two planar bars combined in a form of the broken-V-shape or reversed-broken-V-shape.

Figure 30B:
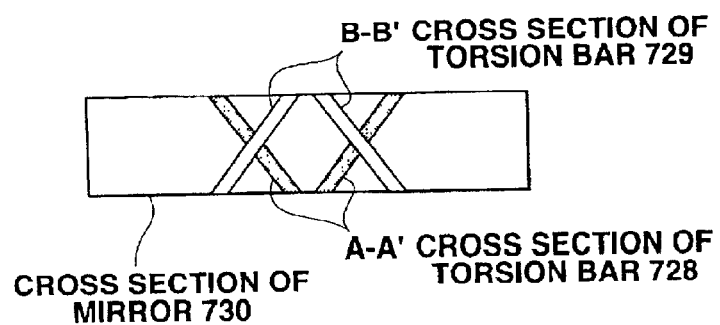
FIG. 30B is a cross-sectional view illustrating torsion springs of the modification of the third embodiment.

More specifically, the A–A' cross section of the torsion spring 728 is symmetric with the B–B' cross section of the torsion spring 729 with respect to a substrate plane (more accurately, a plane including the twisting longitudinal axis of the torsion springs 728 and 729 and parallel to the plane of the mirror 730), as illustrated in FIG. 30B. Thereby, unnecessary modes of motion, such as bending vibrations, and adverse influences of external disturbances caused by the structure of one of the torsion springs 728 and 729 can be offset by the structure of the other. The driving stability can thus be improved.

The micro-optical scanner of this modification can be fabricated by processing a silicon substrate using the crystallographic anisotropic etching, like the third embodiment. The fabrication process shown in FIGS. 29A to 29E can be employed, but the mask layers 650 for forming the other torsion spring 729 are turned up-side-down from the pattern of FIG. 29A in this modification. Thus, the broken-V-shaped and reversed-broken-V-shaped torsion springs 728 and 729 can also be readily fabricated by performing anisotropic etching only once.

Different from the third embodiment, cross sections of two torsion springs 728 and 729 in the micro-optical scanner of this modification differ from each other, as illustrated in FIG. 30B. This can provide a spring structure which can be readily twisted, but is hard to bend. Further, there is no stress-concentration portions in the torsion bars. The spring structure is hence hard to break.

Figure 31:
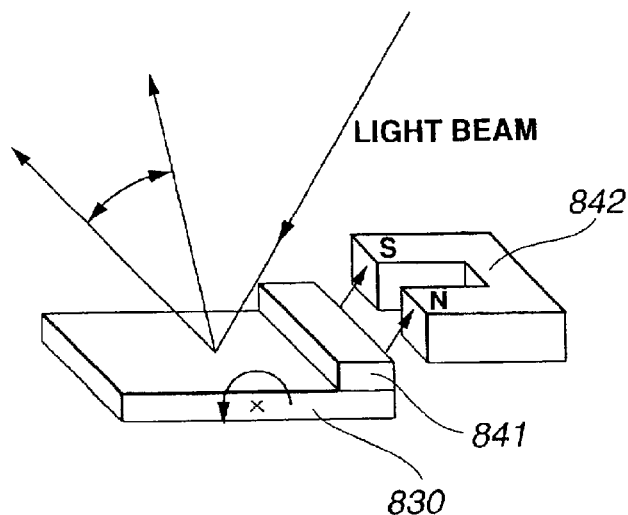
FIG. 31 is a perspective view illustrating the operation of an optical deflector of a fourth embodiment according to the present invention.

FIG. 31 illustrates a micro-optical scanner of a fourth embodiment according to the present invention. Also in this embodiment, torsion springs (not shown in FIG. 31) and a mirror 830 are integrally formed in a single crystal thin plate by bulk micromachining techniques, similar to the above-discussed embodiments and modifications. A moving core 841 of a soft magnetic material is fixed to an end of the mirror 830. A surface of the mirror 830 is coated with a highly-reflective material, and the mirror 830 is supported by the torsion springs rotatably about the twisting longitudinal axis.

A stationary core 842 of a soft magnetic material is arranged on a glass substrate (not shown in FIG. 31), and a coil (not shown in FIG. 31) is wound on the stationary core 842. The silicon plate is disposed opposingly to the glass substrate such that a predetermined distance can be set between parallel opposed surfaces of the moving core 841 of the mirror 830 and the stationary core 842. When the mirror 830 is tilted about the twisting longitudinal axis, an superimposing area (i.e., a cross-sectional area where the moving core 841 crosses a magnetic flux generated by the stationary core 842) between those parallel opposed surfaces is changed. A closed serial magnetic circuit is thus formed by the moving core 841, the stationary core 842, and spacings therebetween.

The operation of the optical scanner of this embodiment will be described. The stationary core 842 is magnetized when a current flows through the coil. FIG. 31 illustrates the condition under which a front end of the stationary core 842 is magnetized to the N pole and a rear end thereof is magnetized to the S pole. Here, the moving core 841 is attracted in a direction in which the above super imposing area of the opposed surfaces increases (i.e., the moving core 841 is attracted into the magnetic flux path generated by the stationary core 842). This direction is indicated by arrows in FIG. 31. The moving and stationary cores 841 and 842 are disposed at different levels when no current flows through the coil, such that the above superimposing area of the opposed surfaces can increase. Therefore, at this time, a rotational moment in a counterclockwise direction (see a circular arrow in FIG. 31) is created about the longitudinal axis of the torsion springs.

The resonance of the mirror 830 about the longitudinal axis of the torsion springs occurs when the current flow in the coil is alternately turned on and off in accordance with the resonance frequency of the mirror 830. When a beam of light is impinged on the mirror 830 under such a condition, the beam of light can be scanned thereby.

Figure 32:
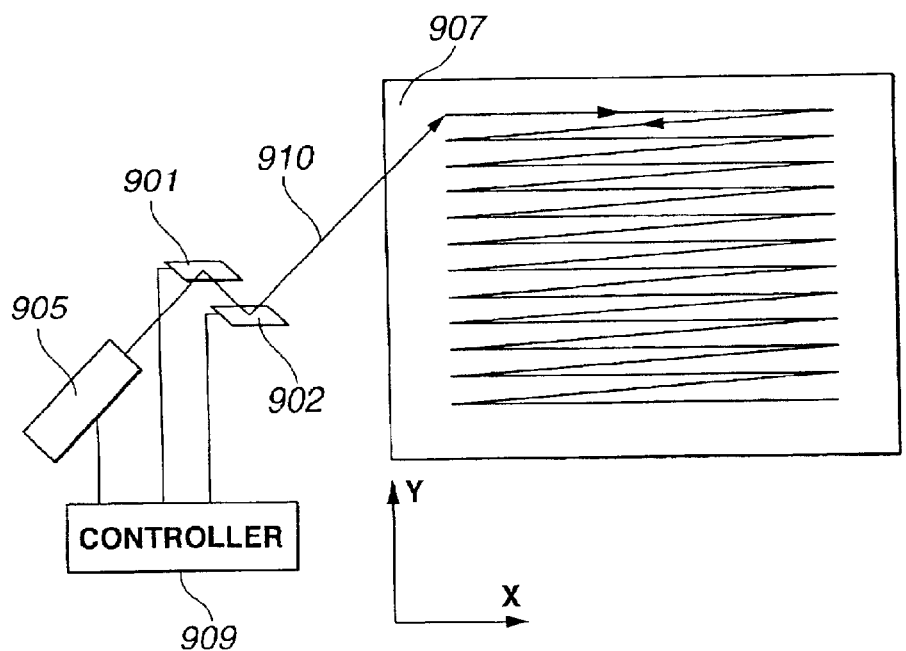
FIG. 32 is a view illustrating an optical scanning type display of a fifth embodiment according to the present invention.

FIG. 32 illustrates a scanning type display of a fifth embodiment according to the present invention. X-directional optical scanner 901 and Y-directional optical scanner 902 are those of the above-described or later-described embodiments and modifications, respectively. A controller 909 controls the X-directional and Y-directional optical scanners 901 and 902 such that a laser beam 910 is scanned in a raster fashion. The controller 909 also controls the modulation of a laser oscillator 905 based on information to be displayed. A picture image is thus displayed on a screen 907 in a two-dimensional manner.

A scanning type display with a definite fine image and a high energy efficiency can be achieved by applying thereto the optical scanner of the present invention.

Figure 33:
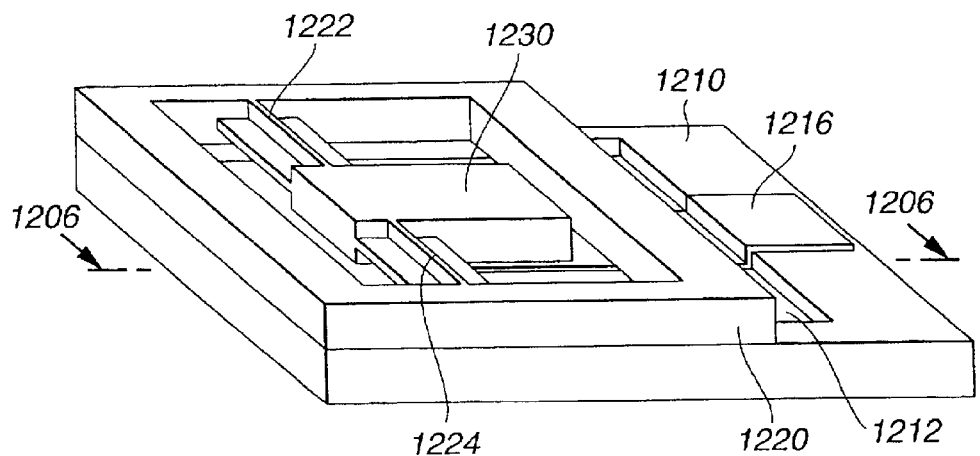
FIG. 33 is a perspective view illustrating an acceleration sensor of a sixth embodiment according to the present invention.
Figure 34:
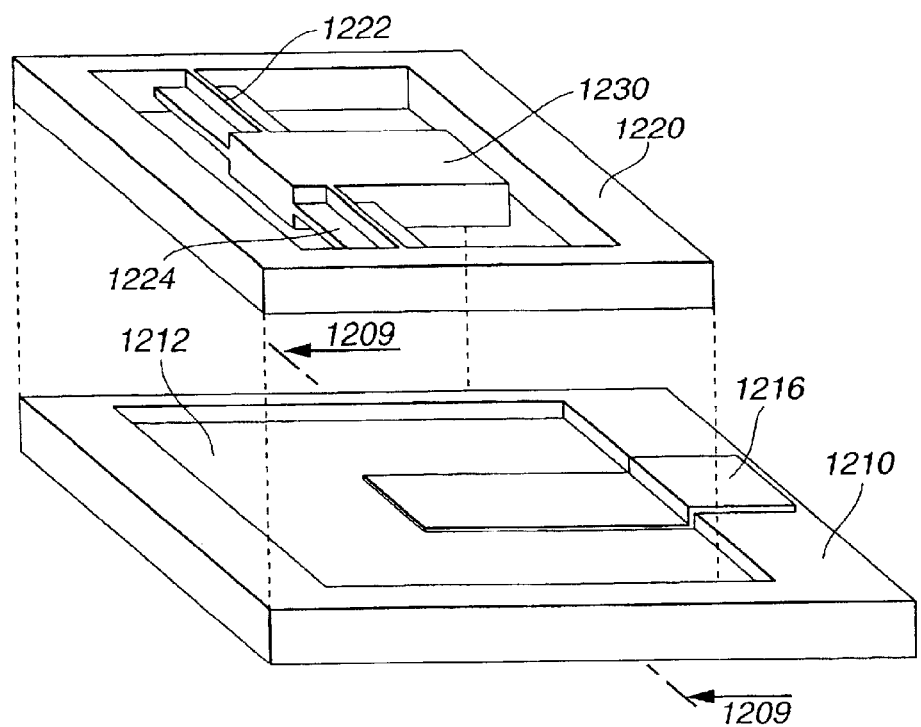
FIG. 34 is a perspective view illustrating the disassembled structure of the sixth embodiment.

FIG. 33 is a perspective view illustrating a sixth embodiment of a acceleration sensor according to the present invention. FIG. 34 is a view illustrating a disassembled structure of the acceleration sensor to show its internal structure. FIG. 35 is a cross-sectional view of FIG. 33 taken along a line 1206, illustrating the cross section of a single crystal silicon thin plate 1220.

In the sixth embodiment of the acceleration sensor, a recess 1212 is formed on an insulating substrate 1210. A sensing electrode 1216 is arranged on the bottom of the recess 1212. In the silicon plate 1220, a pair of torsion springs 1222 and 1224 and a movable or tiltable member 1230 are integrally formed. Each of the torsion springs 1222 and 1224 has a cross section of crisscross shape, as illustrated in FIG. 35. This shape is a dodecagonal shape with four internal angles of 270 degrees and eight internal angles of 90 degrees, and is 90-degree or 180-degree rotationally symmetric. Further, that cross section consists of a plurality of planar portions, and most compliant directions of these planar portions cross at 90 degrees.

The movable member 1230 is supported by the crisscross-shaped torsion springs 1222 and 1224 such that the movable member 1230 can be freely tilted about the twisting longitudinal axis of these springs. The silicon plate 1220 is disposed opposingly to the insulating substrate 1210 such that a predetermined distance can be set between the movable member 1230 and the sensing electrode 1216, as illustrated in FIG. 33. Further, the single crystal silicon thin plate 1220 is electrically grounded.

In the above structure, if the silicon plate 1220 is subjected to an acceleration perpendicular thereto, the force of inertia acts on the movable member 1230 and the movable member 1230 is rotationally deflected about the twisting longitudinal axis of the torsion springs 1222 and 1224. When the rotational deflection of the movable member 1230 occurs, the distance between the movable member 1230 and the sensing electrode 1216 is changed to alter an electrostatic capacity therebetween. Therefore, the acceleration can be detected by detecting the electrostatic capacity between the movable member 1230 and the sensing electrode 1216.

Conversely, if a voltage is applied to the sensing electrode 1216, an electrostatic attractive force acts between the movable member 1230 and the sensing electrode 1216 to rotate the movable member 1230 about the longitudinal axis of the torsion springs 1222 and 1224. Thus, the acceleration sensor of this embodiment can also be used as an electrostatic actuator.

A fabrication method of the above acceleration sensor will be described with reference to FIGS. 36A to 36F and FIGS. 37A to 37E. FIGS. 36A to 36F are cross-sectional views taken along the line 1206 of FIG. 33, and FIGS. 37A to 37E are cross-sectional views taken along the line 1209 of FIG. 34.

The single crystal silicon plate 1220 is processed in the following manner, as illustrated in FIGS. 36A to 36F.

Mask layers 1250 are formed on both surfaces of the silicon plate 1220, respectively. The mask layer 1250 is formed of resist, or the like. A poly-silicon can be used as the silicon plate 1220, and its face orientation may be any one. Patterning of the mask layers 1250 is performed by photo-lithography techniques such that the silicon plate 1220 as illustrated in FIG. 34 can be formed by etching, as illustrated in FIG. 36A.

Etching is then perpendicularly performed to a predetermined depth from both surfaces of the silicon thin plate 1220 other than portions of the torsion springs 1222 and 1224, the movable member 1230, and the surrounding frame portion, by using a deep etching such as ICP-RIE, as illustrated in FIG. 36B. This depth is determined by the thickness of a horizontal bar portion of the crisscross-shaped torsion springs 1222 and 1224. That thickness is about twice that depth. The thickness of a vertical bar portion of the crisscross-shaped torsion springs 1222 and 1224 is determined by the width of a central stripe portion of a mask layer 1251 described below.

After the mask layer 1250 is removed, the new mask layer 1251 is formed and patterned as illustrated in FIG. 36C.

Etching is again perpendicularly performed by using the deep etching such as ICP-RIE. The etching is initially conducted from the bottom surface until the previously-etched bottom surface reaches a center in thickness of the silicon plate 1220, as illustrated in FIG. 36D. Next, the etching is perpendicularly conducted from the top surface until the previously-etched bottom surface penetrates the silicon plate 1220, as illustrated in FIG. 36E.

The mask layer 1251 is finally removed, as illustrated in FIG. 36F.

The insulating substrate 1210 is processed in the following manner, as illustrated in FIGS. 37A to 37E.

Figure 37A:
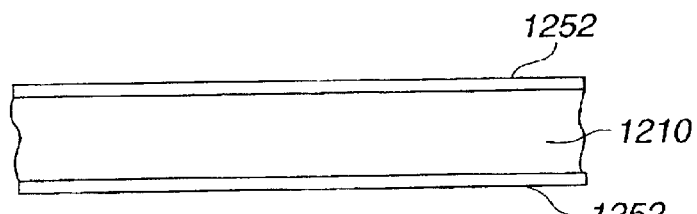
FIGS. 37A to 37E are cross-sectional views illustrating a method of processing a glass substrate of the sixth embodiment taken along the line 1209 of FIG. 34.

Mask layers 1252 are formed on both surfaces of the insulating substrate 1210, respectively, as illustrated in FIG. 37A. The mask layer 1252 is formed of a resist, or the like.

Figure 37B:
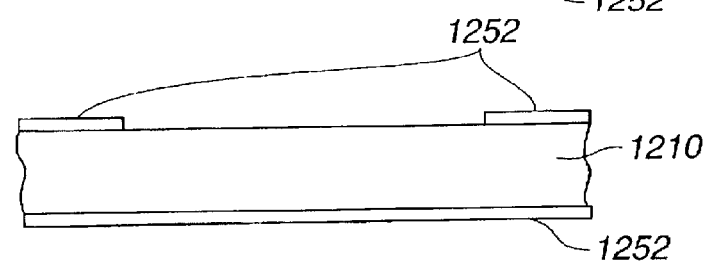
Figure 37C:
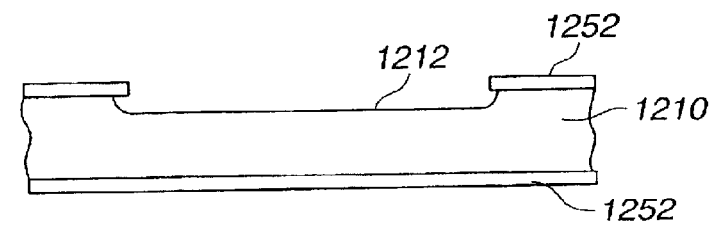

The mask layer 1252 is patterned as illustrated in FIG. 37B. The patterning is conducted such that the insulating substrate 1210 as shown in FIG. 34 can be formed by etching. The etching is performed to form the recess 1212 having a depth of 15 μm, as illustrated in FIG. 37C.

Figure 37D:
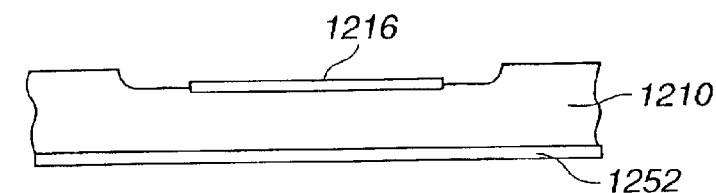

The mask layer 1252 on the upper surface is then removed to form the sensing electrode 1216 on the bottom of the recess 1212, as illustrated in FIG. 37D.

Figure 37E:
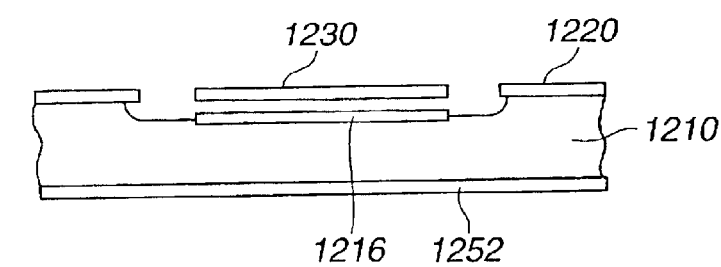

The silicon plate 1220 and the insulating substrate 1210 are bonded as illustrated in FIG. 37E to build the acceleration sensor as shown in FIG. 33.

The thus-fabricated torsion spring with the crisscross cross section as illustrated in FIG. 35 has the feature that its geometrical moment of inertia I is large while its polar moment of inertia J is relatively small. Further, in contrast to the torsion bar having the T-shaped cross section, since the cross-sectional shape of the torsion spring of this embodiment is rotationally symmetric, such a micro-structure, in which no vibratory forces perpendicular to the twisting longitudinal axis occurs at the tilting time, can be provided.

Furthermore, in accord with this embodiment, since the torsion spring is formed of single crystal silicon, a micro-structure with a larger mechanical Q-value than that of poly-silicon can be achieved. Further, since the movable member is hard to vibrate perpendicularly to the twisting longitudinal axis at the tilting time, a mechanical-amount sensor with less noises, higher mechanical Q-value and higher sensitivity can be provided.

Moreover, in accord with this embodiment, since the movable member is hard to vibrate perpendicularly to the twisting longitudinal axis at the tilting time, a highly-precise micro-actuator can be provided. Further, since the mechanical Q-value is high, the amplitude can be enlarged when the resonance driving is conducted, and a micro-actuator with a high energy efficiency can be provided.

The micro-structure of this embodiment can be readily fabricated by the above-discussed fabrication method.

Figure 38:
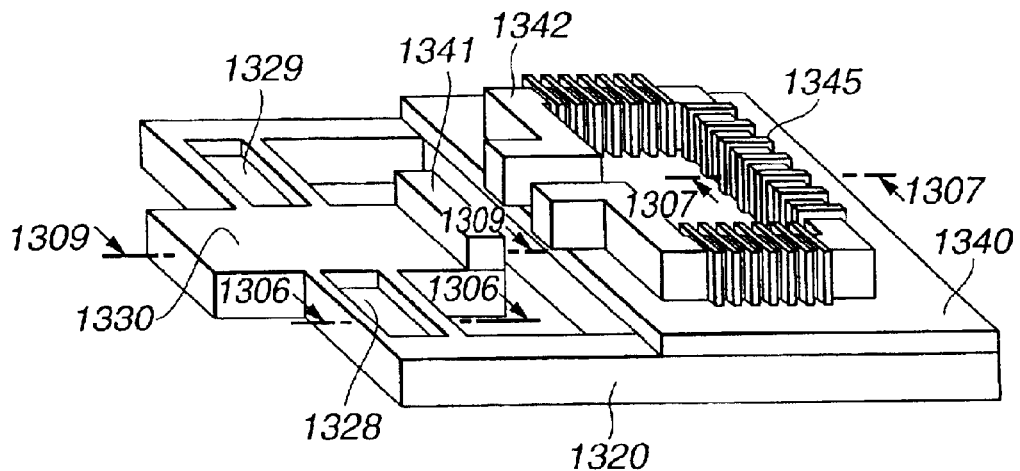
FIG. 38 is a perspective view illustrating an optical deflector of a seventh embodiment according to the present invention.
Figure 39:
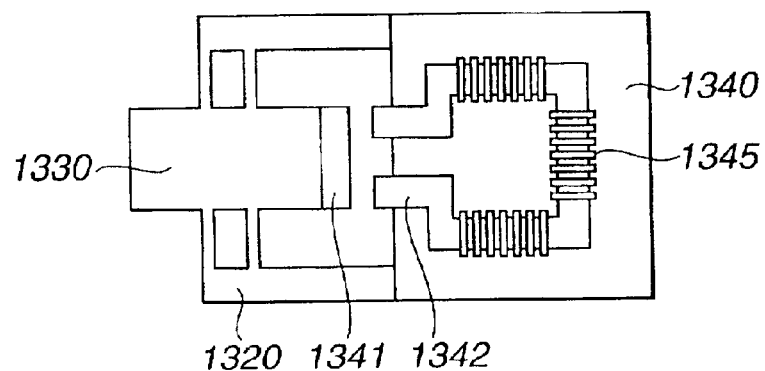
FIG. 39 is a plan view illustrating the seventh embodiment.
Figure 40:
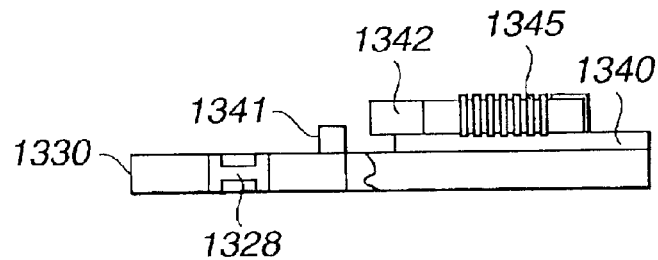
FIG. 40 is a side view illustrating the seventh embodiment.
Figure 41:
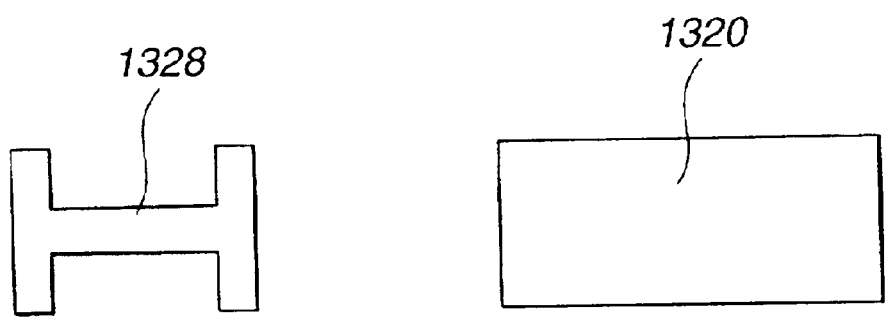
FIG. 41 is a cross-sectional view illustrating a torsion spring of the seventh embodiment taken along the line 1306 of FIG. 38.

FIG. 38 is a perspective view illustrating a seventh embodiment of a micro-optical scanner according to the present invention. FIGS. 39 and 40 are top and side views of FIG. 38, respectively. In FIG. 40, part of a single crystal silicon thin plate 1320 is cut away to clearly show the cross section of a torsion spring 1328. FIG. 41 is a cross-sectional view of FIG. 38 taken along a line 1306, illustrating the cross section of the single crystal silicon thin plate 1320.

In the silicon plate 1320 in the seventh embodiment of the micro-optical scanner, a pair of torsion springs 1328 and 1329 and a mirror 1330 are integrally formed by bulk micromachining techniques. A moving core 1341 of a soft magnetic material is fixed to an end of the mirror 1330. Each of the torsion springs 1328 and 1329 has an H-shaped cross section, as illustrated in FIG. 41. This shape is a dodecagonal shape with four internal angles of 270 degrees and eight internal angles of 90 degrees, and is 180-degree rotationally symmetric. Further, that cross section consists of a plurality of planar portions, and most compliant directions of these planar portions cross at 90 degrees.

A surface of the mirror 1330 is coated with a highly-reflective material, and the mirror 1330 is supported by the torsion springs 1328 and 1329 rotatably about the twisting longitudinal axis.

A stationary core 1342 of a soft magnetic material is arranged on a glass substrate 1340, and a coil 1345 is wound around the stationary core 1342. The silicon plate 1320 is bonded to the glass substrate 1340 such that a predetermined distance can be set between parallel opposed surfaces of the moving core 1341 of the mirror 1330 and the stationary core 1342. When the mirror 1330 is tilted about the twisting longitudinal axis of the torsion springs 1328 and 1329, a superimposing area (i.e., a cross-sectional area where the moving core 1341 crosses the magnetic flux generated by the stationary core 1342) between those parallel opposed surfaces is changed. A closed serial magnetic circuit is thus formed by the moving core 1341, the stationary core 1342, and spacings therebetween.

The optical scanner of this embodiment is operated in the same manner as that described with reference to FIG. 31.

Figure 43A:
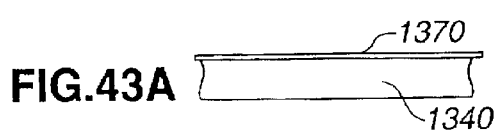
FIGS. 43A to 43N are cross-sectional views illustrating a method of fabricating a stationary core and a coil of the seventh embodiment taken along the line 1307 of FIG. 38.
Figure 43B:
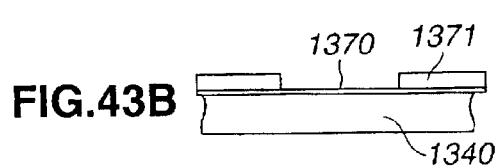

A fabrication method of the optical scanner of this embodiment will be described with reference to FIGS. 42A to 42J and FIGS. 43A to 43N. Left portions of FIGS. 42A to 42J are cross-sectional views taken along p: the line 1306 of FIG. 38, and right portions of FIGS. 42A to 42J are cross-sectional views taken along the line 1309 of FIG. 38, respectively. FIGS. 43A to 43N are cross-sectional views taken along the line 1307 of FIG. 38.

The single crystal silicon plate 1320 is processed in the following manner, as illustrated in FIGS. 42A to 42J.

A seed electrode layer 1360 is initially deposited on a surface of the silicon plate 1320, as illustrated in FIG. 42A.

A thick resist layer 1361 (formed of SU-8 produced by Micro-Chem, for example) is then deposited on the seed electrode layer 1360, and its patterning for forming the moving core 1341 is performed by photolithography techniques, as illustrated in FIG. 42B.

A layer 1362 of soft magnetic material is electroplated on the seed electrode layer 1360, as illustrated in FIG. 42C.

The thick resist layer 1361 and the seed electrode layer 1360 are removed as illustrated in FIG. 42D. The seed electrode layer 1360 under the soft magnetic layer 1362 remains intact.

Mask layers 1350 (formed of a resist, for example) are formed on both surfaces of the silicon plate 1320, and its patterning for forming the silicon plate 1320 as illustrated in FIG. 38 is performed by photolithography techniques, as illustrated in FIG. 42E.

Etching is then perpendicularly performed to a predetermined depth from both surfaces of the silicon thin plate 1320 by using the deep etching such as ICP-RIE, as illustrated in FIG. 42F. This depth is determined by the thickness of a horizontal bridge portion of the H-shaped torsion springs 1328 and 1329. That thickness is about twice that depth.

After the mask layer 1350 is removed, a new mask layer 1351 is formed and patterned as illustrated in FIG. 42G.

Etching is again perpendicularly performed by using the deep etching such as ICP-RIE. The etching is conducted from the bottom surface until the previously-etched bottom surface reaches a center in thickness of the silicon plate 1320, as illustrated in FIG. 42H.

Further, etching is perpendicularly performed by using the deep etching such as ICP-RIE. The etching is perpendicularly conducted from the top surface until the previously-etched bottom surface penetrates the silicon plate 1320, as illustrated in FIG. 42I. In portions of the torsion springs 1328 and 1329, the etching stops at a location where the bridge portions of the H-shaped torsion springs 1328 and 1329 having a predetermined thickness remain intact. The thickness of vertical column portions of the H-shaped torsion springs 1328 and 1329 is set by the width of a pair of stripe portions of the upper and lower mask layers 1351. This thickness is typically equal to the thickness of the above bridge portion.

The mask layer 1351 is finally removed, as illustrated in FIG. 42J.

The glass substrate 1340 is processed in the following manner, as illustrated in FIGS. 43A to 43G.

A seed electrode layer 1370 is formed on a surface of the glass substrate 1340, as illustrated in FIG. 43A. A thick resist layer 1371 is deposited on the seed electrode layer 1370, and its patterning for forming the stationary core 1342 is performed as illustrated in FIG. 43B.

Figure 43C:
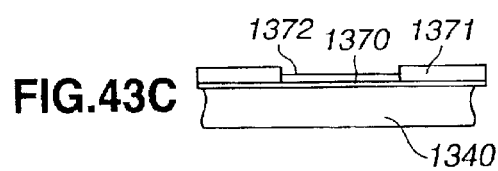
Figure 43D:
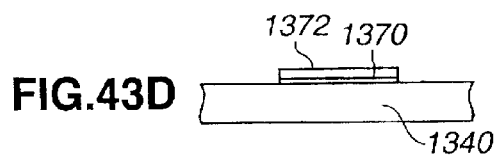

A lower wiring layer 1372 of the coil 1345 is electroplated on the seed electrode layer 1370, as illustrated in FIG. 43C. The thick resist layer 1371 and the seed electrode layer 1370 other than a portion of the lower wiring layer 1372 are removed, as illustrated in FIG. 43D.

Figure 43E:
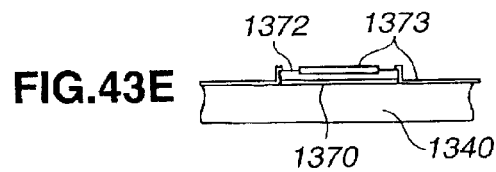

An insulating layer 1373 is formed on the lower wiring layer 1372, and its patterning for forming side wiring layers 1382 and 1383 is performed as illustrated in FIG. 43E.

Figure 43F:
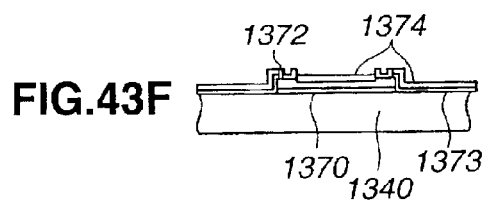
Figure 43G:
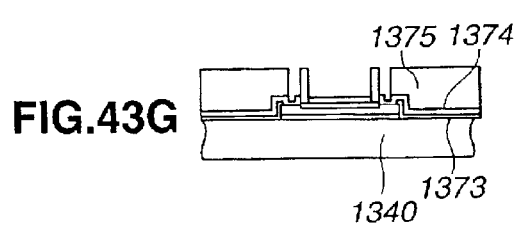

Another seed electrode layer 1374 is formed on the insulating layer 1373, as illustrated in FIG. 43F. Another thick resist layer 1375 is deposited on the seed electrode layer 1374, and its patterning is performed such that a soft magnetic layer 1376 of the stationary core 1342 and the side wiring layers 1382 and 1383 can be formed, as illustrated in FIG. 43G.

Figure 43H:
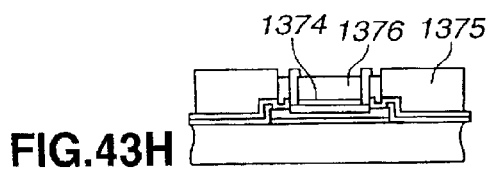

The soft magnetic layer 1376 and the side wiring layers 1382 and 1383 are electroplated on a portion of the seed electrode layer 1374 without the thick resist layer 1375 thereon, as illustrated in FIG. 43H.

Figure 43I:
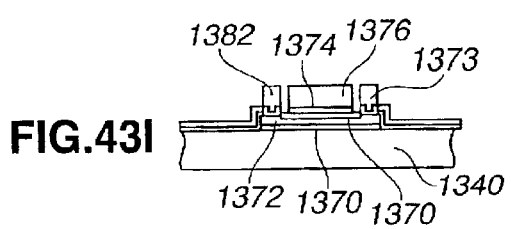

The thick resist layer 1375 and the seed electrode layer 1374 are removed, as illustrated in FIG. 43I.

Figure 43J:
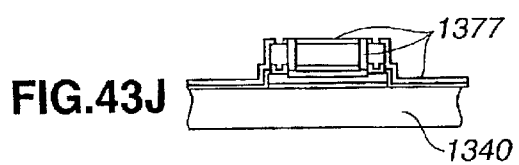

Another insulating layer 1377 is formed, and its patterning for forming an upper wiring layer 1380 is performed, as illustrated in FIG. 43J. Only portions of the insulating layer 1377 on tops of the side wiring layers 1382 and 1383 are removed by this patterning.

Figure 43K:
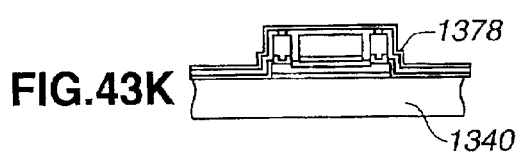
Figure 43L:
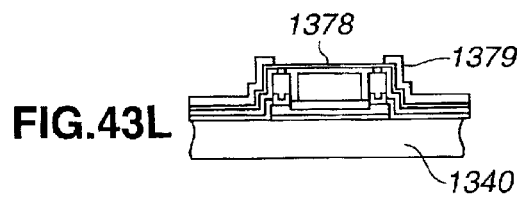

Another seed electrode layer 1378 is formed on the insulating layer 1377, as illustrated in FIG. 43K. Another thick resist layer 1379 is deposited on the seed electrode layer 1378, and its patterning is performed as illustrated in FIG. 43L. Only a portion of the insulating layer 1379 inside of the side wiring layers 1382 and 1383 is removed by this patterning.

Figure 43M:
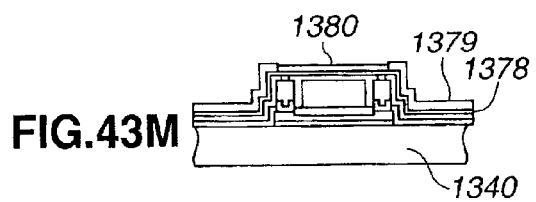
Figure 43N:
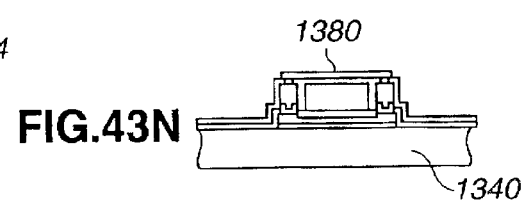

An upper wiring layer 1380 is electroplated on the seed electrode layer 1378, as illustrated in FIG. 43M. Finally, the thick resist layer 1379 and the seed electrode layer 1378 are removed, as illustrated in FIG. 43N.

The single crystal silicon thin plate 1320 and the glass substrate 1340 are bonded to build the optical scanner as illustrated in FIG. 38.

The thus-fabricated torsion spring 1328 with the H-shaped cross section as illustrated in FIG. 41 has the feature that it can be readily twisted, but is hard to bend. Further, since the movable member is hard to vibrate perpendicularly to the twisting longitudinal axis at the tilting time, a highly-precise optical scanner resistant to external disturbances can be provided. In addition, its mechanical Q-value is high, and its amplitude and energy efficiency can be enlarged when the resonance driving is conducted.

This embodiment can also be used in a scanning type display as illustrated in FIG. 32.

Figure 44A:
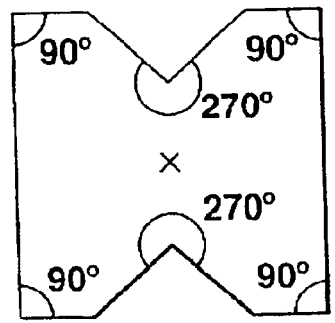
FIGS. 44A and 44B are cross-sectional views illustrating cross sections of other examples of the torsion spring, respectively.
Figure 44B:
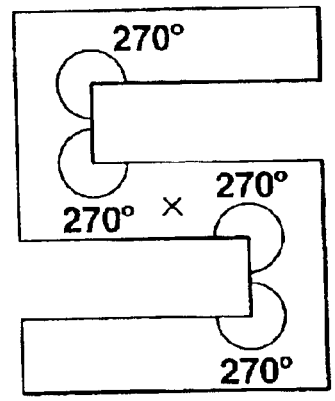

FIGS. 44A and 44B show other examples of the torsion spring whose cross section is 180-degree rotationally symmetric, which consists of a plurality of planar portions, and in which most compliant directions of these planar portions cross. FIG. 44A illustrates an N-shaped cross section, and FIG. 44B illustrates an angular S-shaped cross section.

Figure 45:
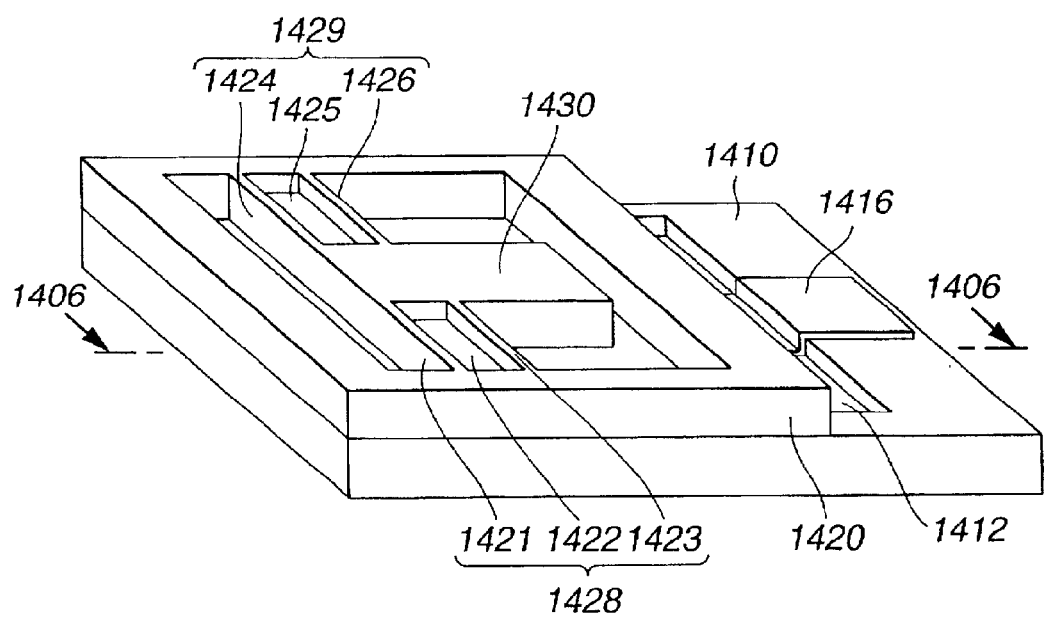
FIG. 45 is a perspective view illustrating an acceleration sensor of an eighth embodiment according to the present invention.
Figure 46:
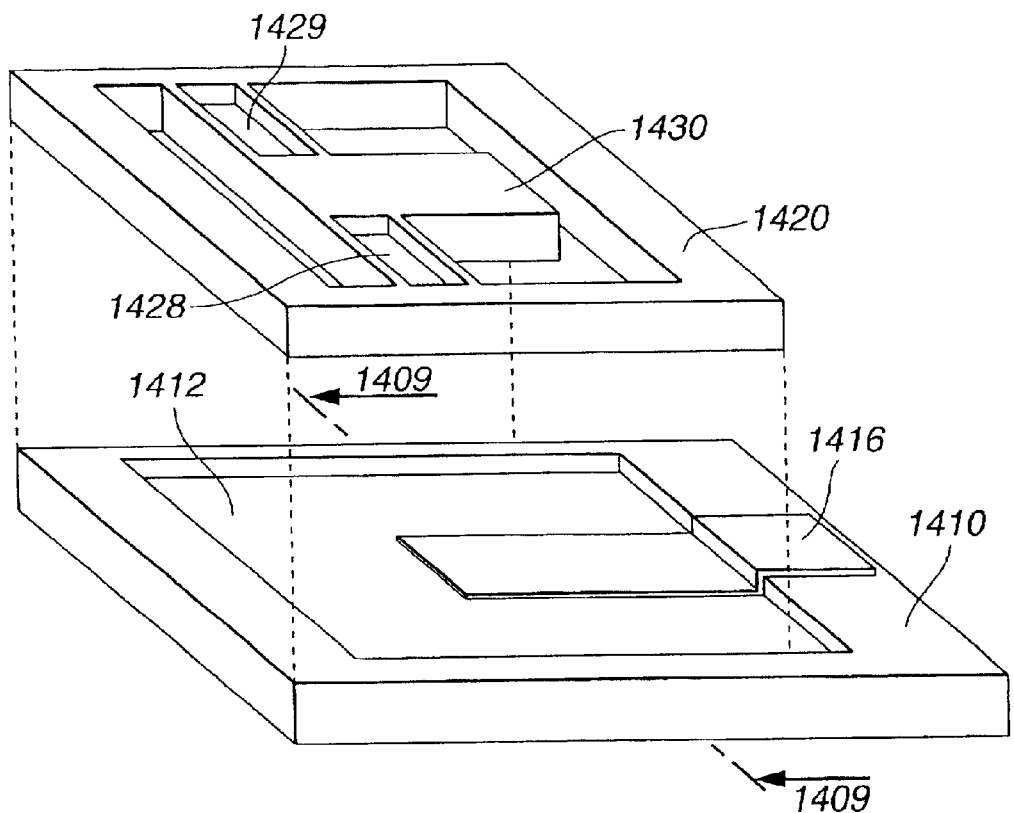
FIG. 46 is a perspective view illustrating the disassembled structure of the eighth embodiment.
Figure 47:
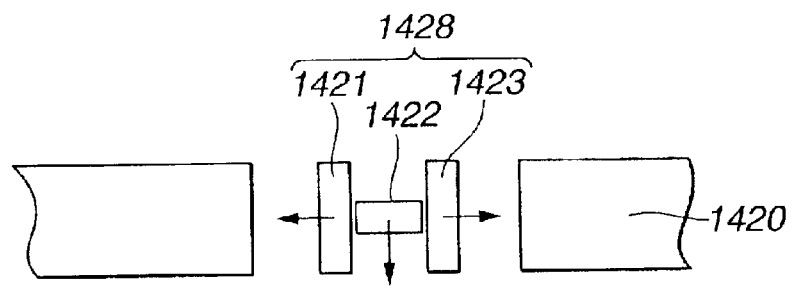
FIG. 47 is a cross-sectional view illustrating a torsion spring of the eighth embodiment taken along the line 1406 of FIG. 45.

FIG. 45 is a perspective view illustrating an eighth embodiment of a acceleration sensor according to the present invention. FIG. 46 is a view illustrating a disassembled structure of the acceleration sensor to show its internal structure. FIG. 47 is a cross-sectional view of FIG. 45 taken along a line 1406, illustrating the cross section of a single crystal silicon thin plate 1420.

In the eighth embodiment of the acceleration sensor, a recess 1412 is formed on an insulating substrate 1410. A sensing electrode 1416 is arranged on the bottom of the recess 1412. In the silicon plate 1420, a pair of sets of torsion springs 1428 and 1429 and a movable or tiltable member 1430 are integrally formed. Each set of the torsion springs 1428 and 1429 has a broken-H-shaped cross section consisting of three separate planar torsion bars 1421–1423 and 1424–1426, as illustrated in FIG. 47. Most compliant directions of these planar torsion bars 1421 (1423) and 1422; 1424 (1426) and 1425 are not parallel to each other, respectively. Further, this broken-H-shaped cross section is symmetric with respect to horizontal and vertical lines.

The movable member 1430 is supported by the broken-H-shaped torsion springs 1428 and 1429 such that the movable member 1430 can be freely tilted about the longitudinal axis of these springs. The silicon plate 1420 is disposed opposingly to the insulating substrate 1410 such that a predetermined distance can be set between the movable member 1430 and the sensing electrode 1416, as illustrated in FIG. 45. Further, the single crystal silicon thin plate 1420 is electrically grounded.

In the above structure, if the silicon plate 1420 is subjected to an acceleration perpendicular thereto, the force of inertia acts on the movable member 1430 and the movable member 1430 is rotationally displaced about the longitudinal axis of the torsion springs 1428 and 1429. When the rotational displacement of the movable member 1430 occurs, the distance between the movable member 1430 and the sensing electrode 1416 is changed to change an electrostatic capacity therebetween. Therefore, the acceleration can be detected by sensing a change in the electrostatic capacity between the movable member 1430 and the sensing electrode 1416 by a conventional means.

Conversely, if a voltage is applied to the sensing electrode 1416, an electrostatic attractive force acts between the movable member 1430 and the sensing electrode 1416 to rotate the movable member 1430 about the longitudinal axis of the torsion springs 1428 and 1429. Thus, the acceleration sensor of this embodiment can also be used as an electrostatic actuator.

A fabrication method of the above acceleration sensor will be described with reference to FIGS. 48A to 48E and FIGS. 37A to 37E. FIGS. 48A to 48E are cross-sectional views taken along the line 1406 of FIG. 45, and FIGS. 37A to 37E are cross-sectional views taken along the line 1409 of FIG. 46.

The single crystal silicon plate 1420 (its face orientation may be any one) is processed in the following manner, as illustrated in FIGS. 48A to 48E.

Figure 48A:
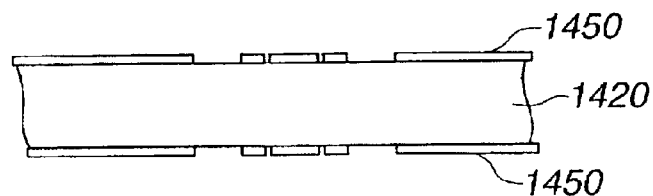
FIGS. 48A to 48E are cross-sectional views illustrating a method of processing a single crystal silicon thin plate of the eighth embodiment.

Mask layers 1450 are formed on both surfaces of the silicon plate 1420, respectively. The mask layer 1450 is formed of resist, or the like. Patterning of the mask layers 1450 is performed by photolithography techniques such that the silicon plate 1420 as illustrated in FIG. 46 can be formed by etching, as illustrated in FIG. 48A.

Figure 48B:
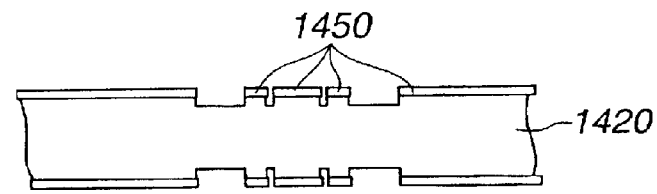

Etching is then perpendicularly performed to a predetermined depth from both surfaces of the silicon thin plate 1420 other than portions of the H-shaped torsion springs 1428 and 1429, the movable member 1430, and the surrounding frame portion, by using the deep etching such as ICP-RIE, as illustrated in FIG. 48B. This depth is determined by the thickness of horizontal torsion bars 1422 and 1425 of the H-shaped torsion springs 1428 and 1429. That thickness is about twice that depth. The thickness of vertical torsion bars 1421 and 1423; 1424 and 1426 of the H-shaped torsion springs 1428 and 1429 is set by the width of a pair of narrower stripe portions on both sides of a central wider stripe portion of the mask layer 1450.

Figure 48C:
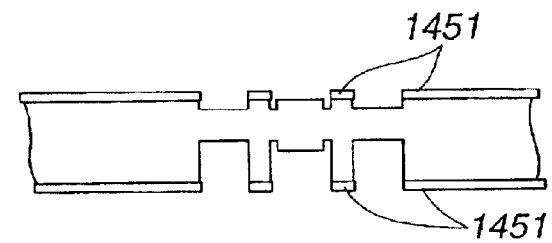

After the mask layer 1450 is removed, another mask layer 1451 is formed and patterned as illustrated in FIG. 48C. The mask layer 1451 is not formed on portions of the horizontal torsion bars 1422 and 1425 of the torsion springs 1428 and 1429, different from the patterning of the mask layer 1450.

Figure 48D:
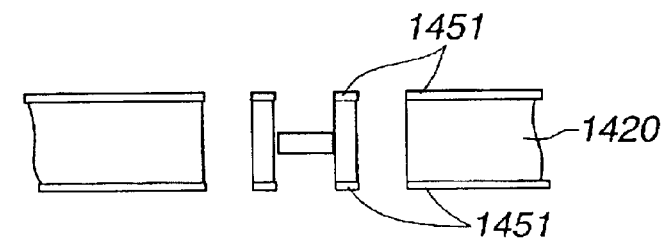

Etching is again perpendicularly performed by using the deep etching such as ICP-RIE. The etching is initially conducted from the bottom surface until the previously-etched bottom surface reaches a center in thickness of the silicon plate 1420, as illustrated in FIG. 48C. Next, the etching is perpendicularly conducted from the top surface until the previously-etched bottom surface penetrates the silicon plate 1420, as illustrated in FIG. 48D.

Figure 48E:
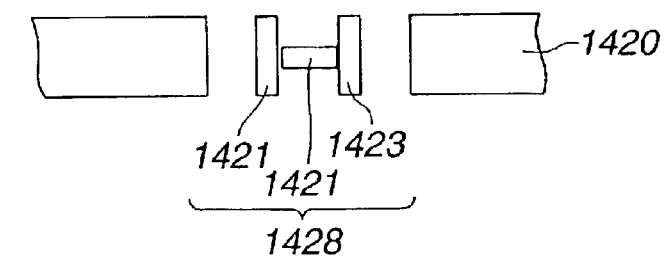

The mask layer 1451 is finally removed, as illustrated in FIG. 48E.

The insulating substrate 1410 is processed by the same manner as that described in the sixth embodiment with reference to FIGS. 37A to 37E.

As illustrated in FIG. 47, since most compliant directions (directions in which the flexural rigidity is lowest and which are indicated by arrows in FIG. 47) of the planar torsion bars 1421 (1423) and 1422; 1424 (1426) and 1425 are combined in a non-parallel relationship, the entire structure of the torsion bars can have a high flexural rigidity.

In accord with this embodiment, since no great stress concentration occurs in contrast to the case of the T-shaped torsion bar, a micro-structure harder to break can be achieved where the same torsion spring with equal torsion spring constant and equal length is considered. Further, in accord with this embodiment, a micro-structure capable of being decreased in size can be achieved compared to the case of the T-shaped torsion bar, where the torsion spring with equal permissible torsional angle is considered. Also in this embodiment, since the torsion spring is formed of single crystal silicon, a micro-structure with a larger mechanical Q-value than that of poly-silicon can be achieved.

Further, in contrast to the torsion bar having the T-shaped cross section, since the cross-sectional shape of each set of the torsion spring of this embodiment is symmetric with respect to horizontal and vertical lines, such a microstructure, in which no vibratory forces perpendicular to the twisting longitudinal axis occurs at the tilting time, can be provided.

Furthermore, in accord with this embodiment, a microstructure with higher mechanical Q-value and higher sensitivity, which is harder to break and capable of being decreased in size, can be achieved. Further, since the movable member is hard to vibrate perpendicularly to the twisting longitudinal axis at the tilting time, a mechanical-amount sensor with less noises can be provided.

Moreover, in accord with this embodiment, a micro-actuator harder to break and capable of being decreased in size can be achieved. Since the mechanical Q-value is high, the amplitude can be enlarged when the resonance driving is conducted, and a micro-actuator with a high energy efficiency can be provided. Further, since the movable member is hard to vibrate perpendicularly to the twisting longitudinal axis at the tilting time, a highly-precise micro-actuator can be provided.

The micro-structure of this embodiment can also be readily fabricated by the above-discussed fabrication method.

Figure 49:
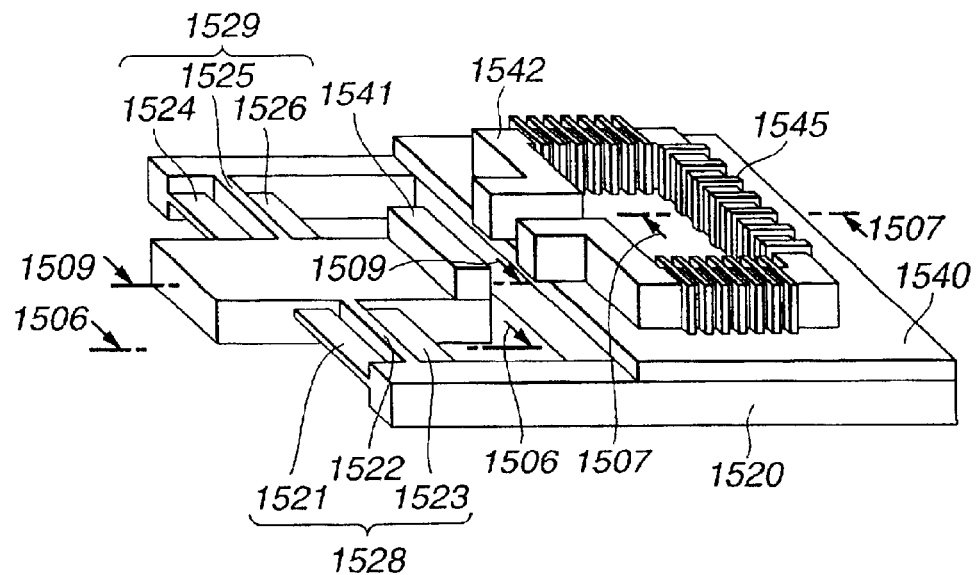
FIG. 49 is a perspective view illustrating an optical deflector of a ninth embodiment according to the present invention.
Figure 50:
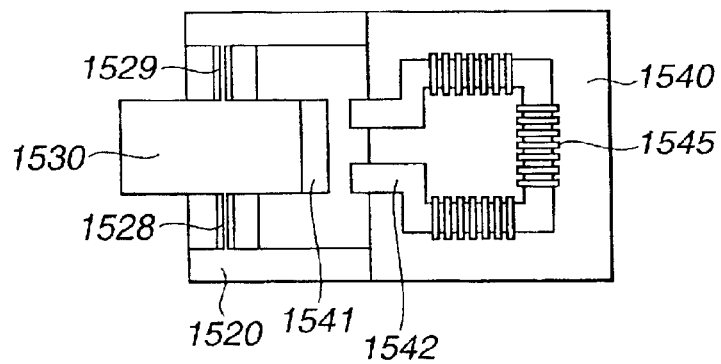
FIG. 50 is a plan view illustrating the ninth embodiment.
Figure 51:
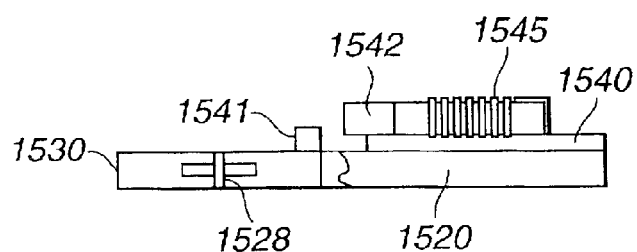
FIG. 51 is a side view illustrating the ninth embodiment.
Figure 52:
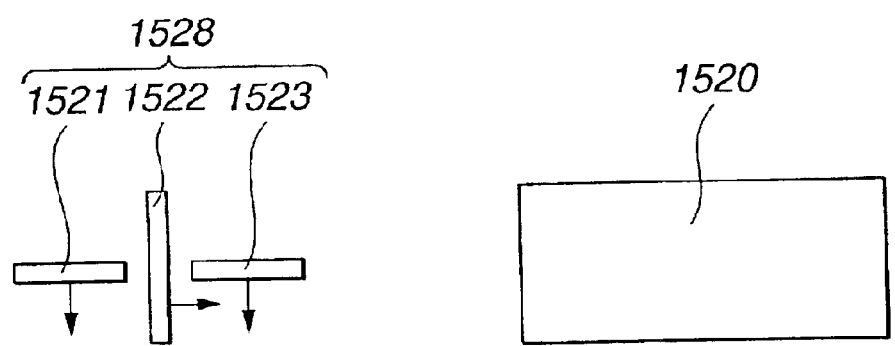
FIG. 52 is a cross-sectional view illustrating a torsion spring of the ninth embodiment taken along the line 1506 of FIG. 49.

FIG. 49 is a perspective view illustrating a ninth embodiment of a micro-optical scanner according to the present invention. FIGS. 50 and 51 are top and side views of FIG. 49, respectively. In FIG. 51, part of a single crystal silicon thin plate 1520 is cut away to clearly show the cross section of a torsion spring 1528. FIG. 52 is a cross-sectional view of FIG. 49 taken along a line 1506, illustrating the cross section of the single crystal silicon thin plate 1520.

In the silicon plate 1520 in the ninth embodiment of the micro-optical scanner, a pair of sets of torsion springs 1528 and 1529 and a mirror 1530 are integral ly formed by bulk micromachining techniques. A moving core 1541 of a soft magnetic material is fixed to an end of the mirror 1530. Each set of the torsion springs 1528 and 1529 has an broken-crisscross-shaped cross section, as illustrated in FIG. 52. This cross section consists of three planar torsion bars 1521–1523 and 1524–1526.

A surface of the mirror 1530 is coated with a highly-reflective material, and the mirror 1530 is supported by the torsion springs 1528 and 1529 rotatably about the twisting longitudinal axis.

A stationary core 1542 of a soft magnetic material with a profile as illustrated in FIG. 49 is arranged on a glass substrate 1540, and a coil 1545 is wound around the stationary core 1542. The silicon plate 1520 is bonded to the glass substrate 1540 such that a predetermined distance can be set between parallel opposed surfaces of the moving core 1541 of the mirror 1530 and the stationary core 1542. When the mirror 1530 is tilted, a superimposing area (i.e., a cross-sectional area where the moving core 1541 crosses the magnetic flux generated by the stationary core 1542) between those parallel opposed surfaces is changed. A closed serial magnetic circuit is thus formed by the moving core 1541, the stationary core 1542, and spacings therebetween.

The operation of the optical scanner of this embodiment is performed in the same manner as that described with reference to FIG. 31.

A fabrication method of the optical scanner of this embodiment will be described with reference to FIGS. 53A to 53J and FIGS. 43A to 43N. Left portions of FIGS. 53A to 53J are cross-sectional views taken along the line 1506 of FIG. 49, and right portions of FIGS. 53A to 53J are cross-sectional views taken along the line 1509 of FIG. 49, respectively. FIGS. 43A to 43N are cross-sectional views taken along a line 1507 of FIG. 49.

The single crystal silicon plate 1520 is processed in the following manner, as illustrated in FIGS. 53A to 53J.

A seed electrode layer 1560 is initially deposited on a surface of the silicon plate 1520, as illustrated in FIG. 53A.

A thick resist layer 1561 (formed of SU-8 produced by Micro-Chem, for example) is then deposited on the seed electrode layer 1560, and its patterning for forming the moving core 1541 is performed by photolithography techniques, as illustrated in FIG. 53B.

A layer 1562 of soft magnetic material is electroplated on the seed electrode layer 1560, as illustrated in FIG. 53C.

The thick resist layer 1561 and the seed electrode layer 1560 are removed as illustrated in FIG. 53D. The seed electrode layer 1560 under the soft magnetic layer 1562 remains unremoved.

Mask layers 1550 (formed of a resist, for example) are formed on both surfaces of the silicon plate 1520, and its patterning for forming the silicon plate 1520 as illustrated in FIG. 49 is performed by photolithography techniques, as illustrated in FIG. 53E.

Etching is then perpendicularly performed to a predetermined depth from both surfaces of the silicon thin plate 1520 by using the deep etching such as ICP-RIE, as illustrated in FIG. 53F. This depth is determined by the thickness of horizontal torsion bars 1521 and 1523; 1524 and 1526 of the crisscross-shaped torsion springs 1528 and 1529. That thickness is about twice that depth.

After the mask layer 1550 is removed, a new mask layer 1551 is formed and patterned as illustrated in FIG. 53G. In this pattern of the mask layer 1551, the stripe mask layer 1551 on the central vertical torsion bar 1522 and 1525 of the crisscross-shaped torsion springs 1528 and 1529 is left, different from the pattern of the mask layer 1550.

Etching is again perpendicularly performed by using the deep etching such as ICP-RIE. The etching is conducted from the bottom surface until the previously-etched bottom surface reaches a center in thickness of the silicon plate 1520, as illustrated in FIG. 53H.

Further, etching is perpendicularly performed by using the deep etching such as ICP-RIE. The etching is perpendicularly conducted from the top surface until the previously-etched bottom surface penetrates the silicon plate 1520, as illustrated in FIG. 53I. In portions of the torsion springs 1528 and 1529, the etching stops at a location where the horizontal torsion bars 1521 and 1523; 1524 and 1526 of the torsion springs 1528 and 1529 are separated and left. The thickness of central vertical torsion bars 1522 and 1525 of the torsion springs 1528 and 1529 is set by the width of a pair of stripe portions of the upper and lower mask layers 1551. This thickness is typically equal to the thickness of the horizontal torsion bars.

The mask layer 1551 is finally removed, as illustrated in FIG. 53J.

The glass substrate 1540 is processed by the same manner as that of the seventh embodiment described with reference to FIGS. 43A to 43G.

The thus-fabricated torsion spring with the crisscross-shaped cross section as illustrated in FIG. 52 has substantially the same advantages as those of the eighth embodiment.

While the present invention has been described with respect to what is presently considered to be the preferred embodiments, it is to be understood that the invention is not limited to the disclosed embodiments. The present invention is intended to cover various modifications and equivalent arrangements included within the spirit and the scope of the appended claims.

What is claimed is:

1. A tiltable-body apparatus comprising:
    a frame member;
    a tiltable body; and
    a pair of torsion springs having a twisting longitudinal axis, said torsion springs being disposed along the twisting longitudinal axis opposingly with said tiltable body being interposed, said torsion springs supporting said tiltable body flexibly and rotatably about the twisting longitudinal axis relative to said frame member, said torsion springs including a plurality of planar portions, compliant directions of which intersect each other when viewed along a direction of the twisting longitudinal axis, and a center of gravity of said tiltable body being positioned on the twisting longitudinal axis of said torsion springs.

2. The tiltable-body apparatus of claim 1, wherein said tiltable body is a planar tiltable body, and at least one of said planar portions of said torsion springs is slant to said planar tiltable body.

3. The tiltable-body apparatus of claim 1, wherein a cross-sectional shape of said each torsion spring perpendicular to the twisting longitudinal axis is 90 degree or 180-degree rotationally symmetric, and said each torsion spring comprises a plurality of planar portions.

4. The tiltable-body apparatus of claim 1, wherein said each torsion spring comprises a plurality of separate planar portions, longitudinal axes of which are set parallel to each other, and compliant directions of which intersect each other when viewed along the direction of the twisting longitudinal axis.

5. The tiltable-body apparatus of claim 1, wherein a cross-sectional shape of said each torsion spring perpendicular to the twisting longitudinal axis is symmetric with respect to a plane including the twisting longitudinal axis.

6. The tiltable-body apparatus of claim 1, wherein said torsion springs are formed of a single crystal material.

7. The tiltable-body apparatus of claim 6, wherein said torsion springs are formed of a single crystal silicon.

8. The tiltable-body apparatus of claim 7, wherein said tiltable body is a planar tiltable body, at least one of said planar portions of said torsion springs has a surface slant to said planar tiltable body, and said slant surface is a (111) face of said single crystal silicon.

9. The tiltable-body apparatus of claim 1, wherein said frame member, said tiltable body, and said torsion springs are integrally formed from a substrate of a single crystal material.

10. The tiltable-body apparatus of claim 9, wherein said single crystal material is a (100) single crystal silicon substrate, said torsion springs are formed by anisotropically etching said single crystal silicon substrate, said tiltable body is a planar tiltable body, at least one of said planar portions of said torsion springs has a surface slant to said planar tiltable body, and said slant surface is a (111) face of said single crystal silicon substrate relative to said (100) substrate face.

11. The tiltable-body apparatus of claim 10, wherein a face relative to said (100) substrate face of a root portion of said each torsion spring, which connects to said frame member or said tiltable body, is a (111) face of said single crystal silicon substrate.

12. The tiltable-body apparatus of claim 1, wherein said torsion springs are formed by performing deep etching, and said each torsion spring is defined by faces perpendicular to said frame member and faces parallel to said frame member.

13. The tiltable-body apparatus of claim 1, wherein a cross section of said each torsion spring perpendicular to the twisting longitudinal axis has a shape of one of V, reversed-V, X, slash, broken-V, broken-reversed-V, crisscross, broken-crisscross, H, broken-H, N, and angular S.

14. The tiltable-body apparatus of claim 1, wherein angles of said torsion springs are rounded by isotropic etching such that stress concentration on said angles of said torsion springs is reduced.

15. The tiltable-body apparatus of claim 1, wherein cross sections of said torsion springs, which are disposed along the twisting longitudinal axis opposingly with said tiltable body being interposed, perpendicular to the twisting longitudinal axis are the same.

16. The tiltable-body apparatus of claim 1, wherein cross sections of said torsion springs, which are disposed along the twisting longitudinal axis opposingly with said tiltable body being interposed, perpendicular to the twisting longitudinal axis are different from each other.

17. The tiltable-body apparatus of claim 16, wherein cross sections of said torsion springs, which are disposed along the twisting longitudinal axis opposingly with said tiltable body being interposed, perpendicular to the twisting longitudinal axis are symmetric with each other with respect to a plane including the twisting longitudinal axis.

18. The tiltable-body apparatus of claim 1, wherein said tiltable body is a planar tiltable body, and cross sections of said torsion springs perpendicular to the twisting longitudinal axis are symmetric with each other with respect to a plane including the twisting longitudinal axis and parallel to said planar tiltable body.

19. The tiltable-body apparatus of claim 4, wherein said each torsion spring comprises a plurality of separate planar torsion bars, and a cross section of said each torsion spring is symmetric with respect to a vertical line.

20. The tiltable-body apparatus of claim 4, wherein said each torsion spring comprises a plurality of separate planar torsion bars, and a cross section of said torsion spring is symmetric with respect to a horizontal line and a vertical line.

21. The tiltable-body apparatus of claim 1, wherein said frame member includes an inner frame member and an outer frame member, said tiltable body includes an inner tiltable body and an outer tiltable body which is said inner frame member for supporting said inner tiltable body through a pair of first torsion springs and is supported by said outer frame member through a pair of second torsion springs, said inner tiltable body is supported flexibly and rotatably about a first twisting longitudinal axis of a pair of said first torsion springs, said outer tiltable body is supported flexibly and rotatably about a second twisting longitudinal axis of a pair of said second torsion springs, and pairs of said first and second torsion springs are disposed along the first and second twisting longitudinal axes opposingly with said inner and outer tiltable body being interposed, respectively.

22. The tiltable-body apparatus of claim 21, wherein the first and second twisting longitudinal axes extend forming an angle of 90 degrees.

23. The tiltable-body apparatus of claim 1, further comprising means for detecting a relative displacement between said frame member and said tiltable body, and wherein the apparatus is constructed as a mechanical-amount sensor.

24. The tiltable-body apparatus of claim 1, further comprising driving means for driving said tiltable body relative to said frame member, and wherein the apparatus is constructed as an actuator.

25. The tiltable-body apparatus of claim 24, wherein said driving means comprises a stationary core, a coil wound on said stationary core, and a moving core bonded to said tiltable body.

26. The tiltable-body apparatus of claim 1, further comprising driving means for driving said tiltable body relative to said frame member, and light deflecting means for deflecting a beam of light impinging on said tiltable body, which is provided on said tiltable body, and wherein the apparatus is constructed as an optical deflector.

27. The tiltable-body apparatus of claim 26, wherein said driving means comprises a stationary core, a coil wound on said stationary core, and a moving core bonded to said tillable body.

28. The tiltable-body apparatus of claim 26, wherein said light deflecting means is one of a light reflective mirror and a diffraction grating.

29. A tiltable-body apparatus comprising:
a frame member;
a planar tiltable body; and
a pair of torsion springs having a twisting longitudinal axis, said torsion springs being disposed along the twisting longitudinal axis opposingly with said tiltable body being interposed, said torsion springs supporting said tiltable body flexibly and rotatably about the twisting longitudinal axis relative to said frame member, said torsion springs including a plurality of planar portions, and at least one of said planar portions of said torsion springs being slant to said planar tiltable body.

30. A tiltable-body apparatus comprising:
a frame member;
a planar tiltable body; and
a pair of torsion springs having a twisting longitudinal axis, said torsion springs being disposed along the twisting longitudinal axis opposingly with said tiltable body being interposed, said torsion springs supporting said tiltable body flexibly and rotatably about the twisting longitudinal axis relative to said frame member, a cross-sectional shape of said each torsion spring perpendicular to the twisting longitudinal axis being 90-degree or 180-degree rotationally symmetric, said each torsion spring including a plurality of planar portions, and compliant directions of said planar portions intersecting each other when viewed along a direction of the twisting longitudinal axis.

31. A tiltable-body apparatus comprising:
a frame member;
a pair of torsion springs; and
a tiltable body which is supported by said frame member via said pair of torsion springs;
wherein said pair of torsion springs is disposed along a twisting longitudinal axis, and
said tiltable body rotates about said pair of torsion springs,
each of said torsion springs is respectively disposed on one side of said tiltable body and another side of said tiltable body which is opposed to said one side of said tiltable body, and wherein
a center of gravity of said tiltable body is positioned on said twisting longitudinal axis of said pair of torsion springs,
each of the torsion springs being comprised of at least one planar portion when viewed along a direction of said twisting longitudinal axis, and a first compliant direction of said planar portion of said one torsion spring and a second compliant direction of said planar portion of said other torsion spring intersect each other.

32. The tiltable-body apparatus of claim 31, wherein said tiltable body is a planar tiltable body, and at least one of said planar portions of said torsion springs is slant to said planar tiltable body.

33. The tiltable-body apparatus of claim 31, wherein a cross-sectional shape of said each torsion spring perpendicular to the twisting longitudinal axis is 90-degree or 180-degree rotationally symmetric, and said each torsion spring comprises a plurality of planar portions.

34. The tiltable-body apparatus of claim 31, wherein said each torsion spring comprises a plurality of separate planar portions, longitudinal axes of which are set parallel to each other, and compliant directions of which intersect each other when viewed along the direction of the twisting longitudinal axis.

35. The tiltable-body apparatus of claim 34, wherein said each torsion spring comprises a plurality of separate planar torsion bars, and a cross section of said each torsion spring is symmetric with respect to a vertical line.

36. The tiltable-body apparatus of claim 34, wherein said each torsion spring comprises a plurality of separate planar torsion bars, and a cross section of said torsion spring is symmetric with respect to a horizontal line and a vertical line.

37. The tiltable-body apparatus of claim 31, wherein a cross-sectional shape of said each torsion spring perpendicular to the twisting longitudinal axis is symmetric with respect to a plane including the twisting longitudinal axis.

38. The tiltable-body apparatus of claim 31, wherein said torsion springs are formed of a single crystal material.

39. The tiltable-body apparatus of claim 38, wherein said torsion springs are formed of a single crystal silicon.

40. The tiltable-body apparatus of claim 39, wherein said tiltable body is a planar tiltable body, at least one of said planar portions of said torsion springs has a surface slant to said planar tiltable body, and said slant surface is a (111) face of said single crystal silicon.

41. The tiltable-body apparatus of claim 31, wherein said frame member, said tiltable body, and said torsion springs are integrally formed from a substrate of a single crystal material.

42. The tiltable-body apparatus of claim 41, wherein said single crystal material is a (100) single crystal silicon substrate, said torsion springs are formed by anisotropically etching said single crystal silicon substrate, said tiltable body is a planar tiltable body, at least one of said planar portions of said torsion springs has a surface slant to said planar tiltable body, and said slant surface is a (111) face of said single crystal silicon substrate relative to said (100) substrate face.

43. The tiltable-body apparatus of claim 42, wherein a face relative to said (100) substrate face of a root portion of said each torsion spring, which connects to said frame member or said tiltable body, is a (111) face of said single crystal silicon substrate.

44. The tiltable-body apparatus of claim 31, wherein said torsion springs are formed by performing deep etching, and said each torsion spring is defined by faces perpendicular to said frame member and faces parallel to said frame member.

45. The tiltable-body apparatus of claim 31, wherein a cross section of said each torsion spring perpendicular to the twisting longitudinal axis has a shape of one of V, reversed-V, X, slash, broken-V, broken-reversed-V, crisscross, broken-crisscross, H, broken-H, N, and angular S.

46. The tiltable-body apparatus of claim 31, wherein angles of said torsion springs are rounded by isotropic etching such that stress concentration on said angles of said torsion springs is reduced.

47. The tiltable-body apparatus of claim 31, wherein cross sections of said torsion springs, which are disposed along the twisting longitudinal axis opposingly with said tiltable body being interposed, perpendicular to the twisting longitudinal axis are the same.

48. The tiltable-body apparatus of claim 31, wherein cross sections of said torsion springs, which are disposed along the twisting longitudinal axis opposingly with said tiltable body being interposed, perpendicular to the twisting longitudinal axis are different from each other.

49. The tiltable-body apparatus of claim 48, wherein cross sections of said torsion springs, which are disposed along the twisting longitudinal axis opposingly with said tiltable body being interposed, perpendicular to the twisting longitudinal axis are symmetric with each other with respect to a plane including the twisting longitudinal axis.

50. The tiltable-body apparatus of claim 31, wherein said tiltable body is a planar tiltable body, and cross sections of said torsion springs perpendicular to the twisting longitudinal axis are symmetric with each other with respect to a plane including the twisting longitudinal axis and parallel to said planar tiltable body.

51. The tiltable-body apparatus of claim 31, wherein said frame member includes an inner frame member and an outer frame member, said tiltable body includes an inner tiltable body and an outer tiltable body which is said inner frame member for supporting said inner tiltable body through a pair of first torsion springs and is supported by said outer frame member through a pair of second torsion springs, said inner tiltable body is supported flexibly and rotatably about a first twisting longitudinal axis of a pair of said first torsion springs, said outer tiltable body is supported flexibly and rotatably about a second twisting longitudinal axis of a pair of said second torsion springs, and pairs of said first and second torsion springs are disposed along the first and second twisting longitudinal axes opposingly with said inner and outer tiltable body being interposed, respectively.

52. The tiltable-body apparatus of claim 51, wherein the first and second twisting longitudinal axes extend forming an angle of 90 degrees.

53. The tiltable-body apparatus of claim 31, further comprising means for detecting a relative displacement between said frame member and said tiltable body, and wherein the apparatus is constructed as a mechanical-amount sensor.

54. The tiltable-body apparatus of claim 31, further comprising driving means for driving said tiltable body relative to said frame member, and wherein the apparatus is constructed as an actuator.

55. The tiltable-body apparatus of claim 54, wherein said driving means comprises a stationary core, a coil wound on said stationary core, and a moving core bonded to said tiltable body.

56. The tiltable-body apparatus of claim 31, further comprising driving means for driving said tiltable body relative to said frame member, and light deflecting means for deflecting a beam of light impinging on said tiltable body, which is provided on said tiltable body, and wherein the apparatus is constructed as an optical deflector.

57. The tiltable-body apparatus of claim 56, wherein said driving means comprises a stationary core, a coil wound on said stationary core, and a moving core bonded to said tiltable body.

58. The tiltable-body apparatus of claim 56, wherein said light deflecting means is one of a light reflective mirror and a diffraction grating.

* * * * *

UNITED STATES PATENT AND TRADEMARK OFFICE
CERTIFICATE OF CORRECTION

PATENT NO. : 6,831,765 B2
DATED : December 14, 2004
INVENTOR(S) : Susumu Yasuda et al.

It is certified that error appears in the above-identified patent and that said Letters Patent is hereby corrected as shown below:

Column 3,
Line 53, "occurs" should read -- occur --.

Column 7,
Lines 1, 25 and 51, "across-sectional" should read -- a cross-sectional --.

Column 9,
Line 45, "Si0$_2$" should read -- SiO$_2$ --.
Line 55, "W," should read -- W$_a$ --.

Column 10,
Line 67, "is" should read -- are --.

Column 11,
Line 50, "up-side-down" should read -- upside down --.

Column 13,
Line 40, "occurs" should read -- occur --.

Column 15,
Line 66, "629;" should read -- 629, --.

Column 17,
Line 50, "up-side-down" should read -- upside down --.
Line 59, "there is" should read -- there are --.

UNITED STATES PATENT AND TRADEMARK OFFICE
CERTIFICATE OF CORRECTION

PATENT NO. : 6,831,765 B2
DATED : December 14, 2004
INVENTOR(S) : Susumu Yasuda et al.

It is certified that error appears in the above-identified patent and that said Letters Patent is hereby corrected as shown below:

Column 18,
Line 59, "a acceleration" should read -- an acceleration --.

Column 20,
Line 38, "occurs" should read -- occur --.

Column 21,
Line 34, "p:" should be deleted.

Column 25,
Line 4, "occurs" should read -- occur --.

Column 30,
Line 25, "said" should read -- said each --.

Signed and Sealed this

Twenty-eighth Day of February, 2006

JON W. DUDAS
*Director of the United States Patent and Trademark Office*